(12) United States Patent
Dorosenco

(10) Patent No.: US 11,641,215 B2
(45) Date of Patent: *May 2, 2023

(54) POWER TRACKER FOR MULTIPLE TRANSMIT SIGNALS SENT SIMULTANEOUSLY

(71) Applicant: QUALCOMM Incorporated, San Diego, CA (US)

(72) Inventor: Alexander Dorosenco, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/486,669

(22) Filed: Sep. 27, 2021

(65) Prior Publication Data

US 2022/0014216 A1 Jan. 13, 2022

Related U.S. Application Data

(63) Continuation of application No. 15/916,101, filed on Mar. 8, 2018, now Pat. No. 11,133,833, which is a
(Continued)

(51) Int. Cl.
*H04B 1/04* (2006.01)
*H04W 52/52* (2009.01)
(Continued)

(52) U.S. Cl.
CPC ............. *H04B 1/04* (2013.01); *H03F 1/0227* (2013.01); *H03F 1/3205* (2013.01); *H03F 3/195* (2013.01);
(Continued)

(58) Field of Classification Search
CPC .. H03F 1/34; H03F 3/68; H03F 3/217; H03G 3/20; H04B 1/04; H04B 1/69;
(Continued)

(56) References Cited

U.S. PATENT DOCUMENTS 5,834,977 A 11/1998 Maehara et al.
5,929,702 A 7/1999 Myers et al.
(Continued)

FOREIGN PATENT DOCUMENTS

CN 101867284 B 11/2012
EP 2222044 A1 8/2010
(Continued)

OTHER PUBLICATIONS

International Search Report and Written Opinion—PCT/US2014/013805—ISAEPO—dated Mar. 20, 2014.
(Continued)

*Primary Examiner* — Shawkat M Ali
(74) *Attorney, Agent, or Firm* — Qualcomm Incorporated

(57) ABSTRACT

Techniques for generating a power tracking supply voltage for a circuit (e.g., a power amplifier) are disclosed. The circuit may process multiple transmit signals being sent simultaneously on multiple carriers at different frequencies. In one exemplary design, an apparatus includes a power tracker and a power supply generator. The power tracker determines a power tracking signal based on inphase (I) and quadrature (Q) components of a plurality of transmit signals being sent simultaneously. The power supply generator generates a power supply voltage based on the power tracking signal. The apparatus may further include a power amplifier (PA) that amplifies a modulated radio frequency (RF) signal based on the power supply voltage and provides an output RF signal.

24 Claims, 10 Drawing Sheets

Related U.S. Application Data continuation of application No. 15/444,083, filed on Feb. 27, 2017, now abandoned, which is a continuation of application No. 13/764,328, filed on Feb. 11, 2013, now Pat. No. 9,608,675.

(51) Int. Cl.
| | | |
|---|---|---|
| *H03F 1/02* | (2006.01) | |
| *H03F 3/195* | (2006.01) | |
| *H03F 3/21* | (2006.01) | |
| *H03F 3/24* | (2006.01) | |
| *H03F 3/68* | (2006.01) | |
| *H03F 1/32* | (2006.01) | |

(52) U.S. Cl.
CPC ............ *H03F 3/211* (2013.01); *H03F 3/245* (2013.01); *H03F 3/68* (2013.01); *H04W 52/52* (2013.01); *H03F 2200/105* (2013.01); *H03F 2200/294* (2013.01); *H03F 2200/336* (2013.01); *H03F 2200/451* (2013.01); *H03F 2200/462* (2013.01)

(58) Field of Classification Search
CPC .......... H04B 1/707; H04B 7/00; H04B 7/005; H04K 1/10; H04L 27/14
USPC .......... 330/84, 127, 251; 370/210, 319, 338; 375/135, 146, 219, 257, 260, 295, 297; 455/69, 101, 522
See application file for complete search history.

(56) References Cited

U.S. PATENT DOCUMENTS

| | | | |
|---|---|---|---|
| 6,009,090 | A * | 12/1999 | Oishi .................... H04B 1/707 370/320 |
| 6,028,486 | A | 2/2000 | Andre |
| 6,300,826 | B1 | 10/2001 | Mathe et al. |
| 6,677,819 | B1 | 1/2004 | Hakala et al. |
| 7,043,213 | B2 | 5/2006 | Robinson et al. |
| 7,092,683 | B2 | 8/2006 | Tanaka et al. |
| 7,139,534 | B2 | 11/2006 | Tanabe et al. |
| 7,469,017 | B2 | 12/2008 | Granstrom et al. |
| 7,706,467 | B2 | 4/2010 | Kenington et al. |
| 8,077,780 | B2 | 12/2011 | Schilling et al. |
| 8,457,246 | B2 | 6/2013 | Kim et al. |
| 8,498,666 | B2 | 7/2013 | Sebire et al. |
| 8,538,353 | B2 | 9/2013 | Wallace |
| 8,553,802 | B2 | 10/2013 | Muhammad |
| 8,570,105 | B2 | 10/2013 | Wimpenny et al. |
| 8,587,271 | B2 | 11/2013 | Kanbe et al. |
| 8,600,455 | B1 | 12/2013 | Zaslavsky et al. |
| 8,718,579 | B2 | 5/2014 | Drogi |
| 8,744,002 | B2 | 6/2014 | Maehata et al. |
| 8,803,603 | B2 | 8/2014 | Wimpenny |
| 8,810,314 | B2 | 8/2014 | Mulawski et al. |
| 8,824,978 | B2 | 9/2014 | Briffa et al. |
| 8,824,981 | B2 * | 9/2014 | Langer .................. H03F 1/0227 455/127.1 |
| 8,854,242 | B1 | 10/2014 | Klepser et al. |
| 8,879,614 | B2 | 11/2014 | Maehata |
| 8,884,697 | B2 | 11/2014 | Hongo |
| 8,897,724 | B2 | 11/2014 | Hou |
| 8,942,652 | B2 | 1/2015 | Khlat et al. |
| 8,995,567 | B2 | 3/2015 | Rofougaran et al. |
| 9,020,453 | B2 | 4/2015 | Briffa et al. |
| 9,071,207 | B2 | 6/2015 | Bai |
| 9,130,623 | B2 | 9/2015 | Suzuki et al. |
| 9,207,692 | B2 | 12/2015 | Khlat et al. |
| 9,277,501 | B2 | 3/2016 | Lorenz et al. |
| 9,294,041 | B2 | 3/2016 | Khlat et al. |
| 9,432,946 | B2 | 8/2016 | Yamanouchi et al. |
| 9,608,675 | B2 | 3/2017 | Dorosenco et al. |
| 11,133,833 | B2 * | 9/2021 | Dorosenco .......... H03F 1/3205 |
| 2004/0061555 | A1 | 4/2004 | Lynch |
| 2005/0053165 | A1 | 3/2005 | Lakkis |
| 2005/0152471 | A1 | 7/2005 | Tanaka et al. |
| 2005/0169395 | A1 | 8/2005 | Monta |
| 2005/0215209 | A1 | 9/2005 | Tanabe et al. |
| 2006/0264186 | A1 | 11/2006 | Akizuki et al. |
| 2008/0080640 | A1 | 4/2008 | Rofougaran |
| 2008/0139140 | A1 | 6/2008 | Matero et al. |
| 2009/0004981 | A1 | 1/2009 | Eliezer et al. |
| 2009/0034653 | A1 | 2/2009 | Rofougaran |
| 2009/0200996 | A1 | 8/2009 | Ojanen et al. |
| 2009/0289720 | A1 | 11/2009 | Takinami et al. |
| 2010/0001793 | A1 | 1/2010 | Van Zeijl et al. |
| 2010/0165829 | A1 | 7/2010 | Narasimha et al. |
| 2010/0233977 | A1 | 9/2010 | Minnis et al. |
| 2010/0291963 | A1 | 11/2010 | Patel et al. |
| 2011/0059707 | A1 | 3/2011 | Kim et al. |
| 2011/0142156 | A1 | 6/2011 | Haartsen |
| 2011/0148705 | A1 | 6/2011 | Kenington |
| 2011/0151806 | A1 | 6/2011 | Kenington |
| 2011/0193629 | A1 | 8/2011 | Hou et al. |
| 2012/0033656 | A1 | 2/2012 | De Maaijer |
| 2012/0039418 | A1 | 2/2012 | Vaisanen |
| 2012/0140743 | A1 | 6/2012 | Pelletier et al. |
| 2012/0214423 | A1 | 8/2012 | Wallace |
| 2012/0229208 | A1 | 9/2012 | Wimpenny et al. |
| 2012/0269240 | A1 | 10/2012 | Balteanu et al. |
| 2012/0275544 | A1 | 11/2012 | Midya et al. |
| 2012/0293253 | A1 | 11/2012 | Khlat et al. |
| 2012/0300824 | A1 | 11/2012 | Maehata et al. |
| 2012/0321018 | A1 | 12/2012 | Chen et al. |
| 2012/0326686 | A1 | 12/2012 | Dai et al. |
| 2012/0326783 | A1 | 12/2012 | Mathe et al. |
| 2012/0327825 | A1 | 12/2012 | Gudem et al. |
| 2013/0034186 | A1 | 2/2013 | Oga |
| 2013/0049858 | A1 | 2/2013 | Wimpenny |
| 2013/0187711 | A1 | 7/2013 | Goedken et al. |
| 2014/0111275 | A1 | 4/2014 | Khlat et al. |
| 2014/0126440 | A1 | 5/2014 | Frank et al. |
| 2014/0135050 | A1 | 5/2014 | Goedken et al. |
| 2014/0199949 | A1 * | 7/2014 | Nagode .................. H04B 1/62 455/73 |
| 2014/0226748 | A1 | 8/2014 | Dorosenco et al. |
| 2017/0170851 | A1 | 6/2017 | Dorosenco |

FOREIGN PATENT DOCUMENTS

| | | |
|---|---|---|
| EP | 2226932 A1 | 9/2010 |
| EP | 2442440 A1 | 4/2012 |
| EP | 2915250 B1 | 5/2017 |
| GB | 2476393 A | 6/2011 |
| JP | 2010512705 A | 4/2010 |
| JP | 2011018994 A | 1/2011 |
| JP | 2012165261 A | 8/2012 |
| WO | 0008774 A1 | 2/2000 |
| WO | 03081793 A1 | 10/2003 |
| WO | 2009153138 A1 | 12/2009 |
| WO | 2012110409 A1 | 8/2012 |
| WO | 2012157418 A1 | 11/2012 |
| WO | 2012175709 | 12/2012 |
| WO | 2012178138 | 12/2012 |
| WO | 2014070474 A1 | 5/2014 |
| WO | 2014123744 | 8/2014 |

OTHER PUBLICATIONS

Jebali C., et al., "Effects of Signal PDF on the Identification of Behavioral Polynomial Models for Multicarrier RF Power Amplifiers," Analog Integrated Circuits and Signal Processing, vol. 73, No. 1, Oct. 2012, pp. 217-224.

Jeong J., et al., "Wideband Envelope Tracking Power Amplifiers with Reduced Bandwidth Power Supply Waveforms and Adaptive Digital Predistortion Techniques", IEEE Transactions on Microwave Theory and Techniques, IEEE Service Center, Piscataway, NJ, us. vol. 57, No. 12, Dec. 9, 2009 (Dec. 9, 2009), pp. 3307-3314, XP011284408, ISSN: 0018-9480, DOI:10.1109/TMTT.2009. 2033298.

(56) References Cited

OTHER PUBLICATIONS

Kalivas G., "Digital Radio System Design," Dec. 11, 2009, pp. 208-209.

Kammeyer K-D., "Telecommunications," 3rd Edition, Nov. 2004, pp. 1-26.

Kang D., et al., "A Multimode/Multiband Power Amplifier With a Boosted Supply Modulator", IEEE Transactions on Microwave Theory and Techniques, IEEE Service Center, Piscataway, NJ, US, vol. 58, No. 10, Oct. 1, 2010 (Oct. 1, 2010), pp. 2598-2608, XP011317521, ISSN: 0018-9480.

Kang, D et al., "LTE Power Amplifier for envelope tracking polar transmitters", Microwave Conference (EUMC), 2010, European, IEEE, Piscataway, NJ, USA, Sep. 28, 2010 (Sep. 28, 2010), pp. 628-631, XP031786114.

Kim D., et al., "Optimization for Envelope Shaped Operation of Envelope Tracking Power Amplifier," IEEE Transactions on Microwave Theory and Techniques, Jul. 2011, vol. 59, No. 7, pp. 1787-1795.

Kudeki E., et al., "Analog Signal Processing," Prentice Hall, Jan. 2007, 18 pages.

"TSW3100 High Speed Digital Pattern Generator," User's Guide, SLLU101A, Nov. 2007, revised Jan. 2008, pp. 1-44.

Leibniz Information Center for Science and Technology University Library, Dec. 11, 2017, 1 page.

Li Y., et al., "High Efficiency Wide Bandwidth Power Supplies for GSM and Edge RF Power Amplifiers", Conference Proceedings/ IEEE International Symposium on Circuits and Systems (ISCAS): May 23-26, 2005, International Conference Center, Kobe, Japan, IEEE Service Center, Piscataway, NJ, May 23, 2005 (May 23, 2005), pp. 1314-1317, XP010815779.

Liu Y-J., et al., "Digital Predistortion for Concurrent Dual-Band Transmitters Using 2-D Modified Memory Polynomials," IEEE Transactions on Microwave Theory and Techniques, vol. 61, No. 1, Jan. 2013, pp. 281-290.

Lyons R.G., "Understanding Digital Signal Processing", Prentice-Hall, 8. Nachdruck vom Apr. 2001, Titelseiten, Inhaltsverzeichnis, pp. 458-475.

Mannheim Court for Patent Matters Case No. 7-O-127/17 for EP2954737 dated Jul. 17, 2017, 31 pages.

MAXIM., "16VP-P Class G Amplifier with Inverting Boost Converter," MAX9738, Mar. 2008, pp. 1-14.

Guyen T-K., et al., "A Low-Power, Wide-Range Variable Gain CMOS RF Transmitter for 900 MHz Wireless Communications," Analog Integrated Circuits and Signal Processing, 2010, vol. 63, pp. 177-183.

Nuszkowski H., "Digital Signal Transmission, Fundamentals of Digital Transmission Systems," 2nd Edition, 2009, pp. 63-73.

Order No. 28: Construing Terms of the Asserted Patents, In the Matter of Certain Mobile Electronic Devices and Radio Frequency and Processing Components Thereof, Investigation No. 337-TA-1065, Mar. 5, 2018, 40 pages.

Podsiadlik T., et al., "Design of Signal Modulator for RF Polar Transmitter", Radio and Wireless Symposium (RWS), 2012 IEEE, IEEE, Jan. 15, 2012 (Jan. 15, 2012), pp. 439-442, XP032153361, DOI: 10.1109/RWS.2012.6175314, ISBN: 978-1-4577-1153-4.

*Qualcomm Inc.* vs. *Apple Distribution International ULC. et al.*, Complaint (Court for Patent Matters, Mannheim, Germany), Jul. 17, 2017, 31 pages.

*Qualcomm Incorporated* v *Intel Corporation*, U.S. Court of Appeals for the Federal Circuit, Nos. 2020-1589, 2020-1590, 2020-1591, 2020-1592, 2020-1593, 2020-1594, filed Jul. 27, 2021, 17 pages.

Rawat K., et al., "Design Methodology for Dual-Band Doherty Power Amplifier With Performance Enhancement Using Dual-Band Offset Lines," IEEE Transactions on Industrial Electronics, Dec. 2012, vol. 59, No. 12, pp. 4831-4842.

Rawat K., et al., "Dual-Band Branch-Line Hybrid with Distinct Power Division Ratio Over the Two Bands," International Journal of RF and Microwave Computer-Aided Engineering Banner, vol. 23, No. 1, Jan. 2013, pp. 90-98.

Rawat K., et al., "Dual-Band RF Circuits and Components for Multi-Standard Software Defined Radios," IEEE Circuits and Systems Magazine, vol. 12, No. 1, Feb. 21, 2012, pp. 12-32.

Rawat M., et al., "Joint Mitigation of Nonlinearity and Modulator Imperfections in Dual-Band Concurrent Transmitter using Neural Networks," Electronics Letters, vol. 49, No. 4, Feb. 14, 2013, 2 pages.

Rawat M., et al., "Recent Advances on Signal Processing Solutions for Distortion Mitigation Due to Power Amplifier and Non-Ideality of Transmitter System," Recent Patents on Signal Processing, vol. 1, 2011, pp. 135-142.

Razavai B., "Introduction to Data Conversion and Processing," in: Principles of Data Conversion System Design, IEEE, Inc, Newyork, Wiley-Interscience, 1995, pp. 1-6.

Reply Brief of Appellant Qualcomm Incorporated, U.S. Court of Appeals for the Federal Circuit, Nos. 2020-1589, 2020-1590, 2020-1591, 2020-1592, 2020-1593, 2020-1594, filed Jul. 6, 2020, 38 pages.

Report on the Filing or Determination of an Action Regarding a Patent or Trademark 3:17cv01375, 2017, 1 page.

Sauter M., "From GSM to LTE: An Introduction to Mobile Networks and Mobile Broadband," John Wiley & Sons, 2011, 452 pages.

Sklar B., Digital Communications, Fundamentals and Applications Second Edition, 2001, pp. 204-209.

Stauth J.T., et al., "Energy Efficient Wireless Transmitters: Polar and Direct-Digital Modulation Architectures," Feb. 4, 2009, pp. 1-183.

Stauth, J.T., et al., "Optimum Bias Calculation for Parallel Hybrid Switching-Linear Regulators", Applied Power Electronics Conference, APEC 2007—Twenty Second Annual IEEE, IEEE, PI, Feb. 1, 2007 (Feb. 1, 2007), pp. 569-574, XP031085267.

Wang F., et al., "A Monolithic High-Efficiency 2.4-GHz 20-dBm SiGe BiCMOS Envelope-Tracking OFDM Power Amplifier," IEEE Journal of Solid-State Circuits, Jun. 2007, vol. 42, No. 6, pp. 1271-1281.

Wang F., et al., "Design of Wide-Bandwidth Envelope-Tracking Power Amplifiers for OFDM Applications", IEEE Transactions on Microwave Theory and Techniques, vol. 53, No. 4, Apr. 2005, pp. 1244-1255.

Weinstein S.B., et al., "Data Transmission by Frequency-Division Multiplexing Using the Discrete Fourier Transform," IEEE Transactions on Communication Technology, vol. Com-19, No. 5, Oct. 1971, pp. 628-634.

Younes M., et al., "An Accurate Predistorter Based on a Feedforward Hammerstein Structure," IEEE Transactions on Broadcasting, Sep. 2012, vol. 58, No. 3, pp. 454-461.

Yu X., "Contributions to Digital Predistortion of Radio-Frequency Power Amplifiers for Wireless Applications," 2012, 144 pages.

Zellmer J., "Understanding HSPA+ Cellular Technology," Electronic Design, Jun. 6, 2012, pp. 1-15, URL: https://www.electronicdesign.com/communications/understandinghspa-cellular-technology.

Zhu Q., et al., "A Digital Polar Transmitter with DC-DC Converter Supporting 256-QAM WLAN and 40 MHz LTE-A Carrier Aggregation," IEEE Radio Frequency Integrated Circuits Symposium, 2016, pp. 198-201.

337-TA-1065 Order No. 28 Construing the Terms of the Asserted Patents Mar. 5, 2018, 40 pages.

"3GPP TS 25.104, 3rd Generation Partnership Project; Technical Specification Group Radio Access Network; Base Station (BS) radio transmission and reception (FDD)," V9.1.0, Release 9, Sep. 2009, 7 pages.

"3GPP TS 36.101, 3rd Generation Partnership Project; Technical Specification Group Radio Access Network; Evolved Universal Terrestrial Radio Access (E-UTRA); User Equipment (UE) radio transmission and reception," V11.2.0, Release 11, Sep. 2012, 15 pages.

"3GPP TS 36.211, 3rd Generation Partnership Project; Technical Specification Group Radio Access Network; Physical Channels and Modulation," V0.1.2, Release 8, Nov. 2006, 22 pages.

"3rd Generation Partnership Project; Technical Specification Group Radio Access Network; Further Advancements for E-UTRA; LTE-Advanced Feasibility Studies in RAN WG4 (Release 9)", 3GPP

(56) References Cited

OTHER PUBLICATIONS

Standard; 3GPP TR 36.815 ,3rd Generation Partnership Project (3GPP), Mobile Competence Centre; 650, Route Des Lucioles, F-06921, Sophia-Antipolis Valbonne, France, V9.1.0, Jun. 21, 2010 (Jun. 21, 2010), pp. 1-29, XP050441978.
Aitto-Oja T., "High Efficiency Envelope Tracking Supply Voltage Modulator for High Power Base Station Amplifier Applications", Konferenzband Microwave Symposium Digest (MTT) 2010 IEEE MTT-S, May 23-28, 2010, pp. 668-671.
Akbarpour M., et al., "A Transformer-Less Load-Modulated (TLLM) Architecture for Efficient Wideband Power Amplifiers," IEEE Transactions on Microwave Theory and Techniques, Sep. 2012, vol. 60, No. 9, pp. 2863-2874.
Anritsu., "Understanding LTE-Advanced," Carrier Aggregation, pp. 1-71.
Appliation Notes for RF & Microwave—Technical Documents—TI.com, Nov. 19, 2017, 2 pages.
Bassam S.A., et al., "2-D Digital Predistortion (2-D-DPD) Architecture for Concurrent Dual-Band Transmitters," IEEE Transactions on Microwave Theory and Techniques, Oct. 2011, vol. 59, No. 10, pp. 2547-2553.
Bassam S.A., et al., "Linearization of Concurrent Dual-Band Power Amplifier Based on 2D-DPD Technique," IEEE Microwave and Wireless Components Letters, vol. 21, No. 12, Dec. 2011, pp. 685-687.
Bassam S.A., et al., "Subsampling Feedback Loop Applicable to Concurrent Dual-Band Linearization Architecture," IEEE Transactions on Microwave Theory and Techniques, vol. 60, No. 6, Jun. 2012, pp. 1990-1999.
Besprozvanny A., et al., "Highly Efficient Transmitter for High Peak to Average Power Ratio(PAPR) Waveforms", Technical Report 20110121351, Space and Naval Warfare Systems Center, San Diego, CA, Jan. 19, 2011, 50 pages. Website ntrl.ntis.gov/NTRL/dashboard/searchResults/titleDetail/ADA535331.xhtml, heruntergeladen am, Nov. 12, 2017.
Blanken B.G., et al., "A 50MHz Bandwidth Multi-Mode PA Supply Modulator for GSM, EDGE and UMTS Application," IEEE Radio Frequency Integrated Circuits Symposium, Apr. 2008, pp. 401-404.
Bragg M., et al., "Advanced Wayback Machine Navigation and Troubleshooting," 2009, 3 pages.
Brief of Appellant Qualcomm Incorporated, U.S. Court of Appeals for the Federal Circuit, Nos. 2020-1589, 2020-1590, 2020-1591, 2020-1592, 2020-1593, 2020-1594, filed Jul. 6, 2020, 58 pages.
Chan K., "GC5325 Envelope Tracking", Texas Instruments Application Report, SLWA058, Jan. 2010, 16 pages, Website https://web.archive.org/web/20120612151643/ http://www.eetindia.co.in/STATIC/PDF/201003/EEIOL_2010MAR18_RFD_AN_01.pdf aus dem Wayback-Internet-Archiv, heruntergeladen am Oct. 30, 2017; https://webarchive.jira.com/wiki/ display/ARIH/Advanced+ Wayback+ Machine+Navigation+and+ Troubleshooting.
Chan K., "GC5325 Envelope Tracking", Texas Instruments Application Report, SLWA058B, Apr. 2010, 14 pages, Ausdruck von http://www.ti.com/analog/docs/analogtechdoc_hh. tsp?ViewType=mostuseful&rootFamilyId=367&familyId=367 &docTitle=envelope &docCategoryId=1, heruntergeladen Nov. 19, 2017.
Chan K., "GC5325 Envelope Tracking", Texas Instruments Application Report, SLWA058B, Jan. 2010—Revised Apr. 2010, 12 pages.
Chen W., et al., "Hybrid Envelope Tracking for Efficiency Enhancement in Concurrent Dual-Band PAs", Microwave and Optical Technology Letters, vol. 54, No. 3, Mar. 2012, pp. 662-664 (Online Version).
Chen W., et al., "Hybrid Envelope Tracking for Efficiency Enhancement in Concurrent Dual-Band PAs", Microwave and Optical Technology Letters, vol. 54, No. 3, Mar. 2012, pp. 662-664 (Print Version).
Choi, et al., "Envelope Tracking Power Amplifier Robust to Battery Depletion," 2010 IEEE MTT-S International Microwave Symposium Digest (MTT), May 2010, pp. 1074-1077.
Choi J., et al., "A New Power Management IC Architecture for Envelope Tracking Power Amplifier," IEEE Transactions on Microwave Theory and Techniques, vol. 59, No. 7, Jul. 2011, pp. 1796-1802.
Choi, J et al., "A Polar Transmitter With CMOS Programmable Hysteretic-Controlled Hybrid Switching Supply Modulator for Multi standard Applications", IEEE Transactions on Microwave Theory and Techniques, IEEE Service Center, Piscataway, NJ, US, vol. 57, No. 7, Jul. 1, 2009 (Jul. 1, 2009), pp. 1675-1686, XP011258456.
Choi J., "A Study on Polar Modulated Power Transmitters for Wireless Communication," 2010, 159 pages.
Chu W-Y., et al., "A 10 MHz Bandwidth, 2 mV Ripple PA Regulator for CDMA Transmitters," IEEE Journal of Solid-State Circuits, Dec. 2008, vol. 43, No. 12, pp. 2809-2819.
Cisco Systems, et al., "Internetworking Technologies Handbook," Fourth Edition, Cisco Press, 2004, pp. 289-334.
Complainant Qualcomm Incorporated's Initial Claim Construction Brief, In the Matter of Certain Mobile Electronic Devices and Radio Frequency and Processing Components Thereof, Investigation No. 337-TA-1065, Dec. 4, 2017, 88 pages.
Cox C., "An Introduction to LTE LTE: LTE-Advanced, SAE and 4G Mobile Communications," 2012, 18 pages.
Dahlman E., et al., "4G LTE/LTE-Advanced for Mobile Broadband," Amsterdam, Elsevier Academic Press, 2011, 23 pages.
Decision of Technical Board of Appeal of the European Patent Office Setting Aside the Decision of the Opposition Division Revoking the European Patent EP2954737, dated Apr. 13, 2021, 10 pages.
Desquioiz R., "Vector Signal Generator R&S SMU 200A", Retrieved from the Internet: https://cdn.rohde-schwarz.com/pws/dl_downloads/dl_common_library/dl_news_from_rs/185/n185_smu200a.pdf Mar. 31, 2005 (Mar. 31, 2005); XP055460371, 1 Page.
Ertl H., et al., "Basic Considerations and Topologies of Switched-Mode Assisted Linear Power Amplifiers," IEEE Transactions on Industrial Electronics, Feb. 1997, vol. 44, No. 1, pp. 116-123.
European Patent Office Decision Revoking the European Patent EP2954737, dated Jun. 7, 2019, 2 pages.
European Patent Office Notice of Opposition, EP2954737, Apple Inc., Jan. 11, 2018, 1 page.
European Patent Office Notice of Opposition, EP2954737, Intel Inc., Jan. 11, 2018, 1 page.
European Search Report—EP17163460—Search Authority—The Hague—dated May 11, 2017.
Final Written Decision of the Patent Trial and Appeal Board in IPR2018-01326 Determining All Challenged Claims of U.S. Pat. No. 9,608,675 Unpatentable, dated Jan. 14, 2020, 65 pages.
Final Written Decision of the Patent Trial and Appeal Board in IPR2018-01327 Determining All Challenged Claims of U.S. Pat. No. 9,608,675 Unpatentable, dated Jan. 14, 2020, 82 pages.
Final Written Decision of the Patent Trial and Appeal Board in IPR2018-01328 Determining All Challenged Claims of U.S. Pat. No. 9,608,675 Unpatentable, dated Jan. 14, 2020, 81 pages.
Final Written Decision of the Patent Trial and Appeal Board in IPR2018-01329 Determining All Challenged Claims of U.S. Pat. No. 9,608,675 Unpatentable, dated Jan. 14, 2020, 83 pages.
Final Written Decision of the Patent Trial and Appeal Board in IPR2018-01330 Determining All Challenged Claims of U.S. Pat. No. 9,608,675 Unpatentable, dated Jan. 14, 2020, 86 pages.
Final Written Decision of the Patent Trial and Appeal Board in IPR2018-01340 Determining All Challenged Claims of U.S. Pat. No. 9,608,675 Unpatentable, dated Jan. 14, 2020, 88 pages.
Ghannouchi F.M., et al, "Accurate Power Efficiency Estimation of GHz Wireless Delta-Sigma Transmitters for Different Classes of Switching Mode Power Amplifiers," IEEE Transactions on Microwave Theory and Techniques, vol. 58, No. Nov. 11, 2010, pp. 2812-2819.
Hanzo L., et al., "Quadrature Amplitude Modulation," From Basics to Adaptive Trellis-Coded, Turbo-Equalised and Space-Time Coded OFDM, CDMA and MC-CDMA Systems, Second Edition, Chapter 1, 2004, pp. 2-41.

(56) References Cited

OTHER PUBLICATIONS

Hanzo L., et al., "Quadrature Amplitude Modulation," From Basics to Adaptive Trellis-Coded, Turbo-Equalised and Space-Time Coded OFDM, CDMA and MC-CDMA Systems, Second Edition, Chapter 15, 2004, pp. 398-423.
Hanzo L., et al., "Quadrature Amplitude Modulation," From Basics to Adaptive Trellis-Coded, Turbo-Equalised and Space-Time Coded OFDM, CDMA and MC-CDMA Systems, Second Edition, Chapter 4, 2004, pp. 87-131.
Hanzo L., et al., "Quadrature Amplitude Modulation," From Basics to Adaptive Trellis-Coded, Turbo-Equalised and Space-Time Coded OFDM, CDMA and MC-CDMA Systems, Second Edition, Chapter 5, 2004, pp. 133-148.
Hanzo L., et al., "Quadrature Amplitude Modulation," From Basics to Adaptive Trellis-Coded, Turbo-Equalised and Space-Time Coded OFDM, CDMA and MC-CDMA Systems, Second Edition, Contents, 2004, 26 pages.
International Preliminary Report on Patentability—PCT/US2014/013805, The International Bureau of WIPO—Geneva, Switzerland, dated Aug. 20, 2015.
Ochiai H., et al., "On the Distribution of the Peak-to-Average Power Ratio in OFDM Signals", IEEE Transactions on Communications, vol. 49, No. 2, Feb. 2001, pp. 282-289.
Wikipedia, "Fourier-Transformation", Mar. 8, 2022, 13 Pages, https://de.wikipedia.org/wiki/Fourier-Transformation.
Wikipedia, "Mittelwert", Mar. 10, 2022, 14 Pages, https://de.wikipedia.org/wiki/Mittelwert.
Wikipedia, "Quadratisches Mittel", Mar. 10, 2022, 2 Pages, https://de.wikipedia.org/wiki/Quadratisches_Mittel.
Wikipedia, "Root Mean Square", Mar. 10, 2022, 9 Pages, https://en.wikipedia.org/wiki/Root_mean_square.

\* cited by examiner

POWER TRACKER FOR MULTIPLE TRANSMIT SIGNALS SENT SIMULTANEOUSLY

BACKGROUND

I. Related Applications

This application is a continuation of U.S. patent application Ser. No. 15/916,101 filed on Mar. 8, 2018, now U.S. Pat. No. 11,133,833 issued on Sep. 28, 2021, which is a continuation of U.S. patent application Ser. No. 15/444,083 filed on Feb. 27, 2017, which is a continuation of U.S. patent application Ser. No. 13/764,328 filed on Feb. 11, 2013, now U.S. Pat. No. 9,608,675 issued on Mar. 28, 2017.

II. Field

The present disclosure relates generally to electronics, and more specifically to techniques for generating a power supply voltage for a circuit such as an amplifier.

III. BACKGROUND

A wireless device (e.g., a cellular phone or a smartphone) in a wireless communication system may transmit and receive data for two-way communication. The wireless device may include a transmitter for data transmission and a receiver for data reception. For data transmission, the transmitter may process (e.g., encode and modulate) data to generate output samples. The transmitter may further condition (e.g., convert to analog, filter, amplify, and frequency upconvert) the output samples to generate a modulated radio frequency (RF) signal, amplify the modulated RF signal to obtain an output RF signal having the proper transmit power level, and transmit the output RF signal via an antenna to a base station. For data reception, the receiver may obtain a received RF signal via the antenna and may amplify and process the received RF signal to recover data sent by the base station.

The transmitter typically includes a power amplifier (PA) to provide high transmit power for the output RF signal. The power amplifier should be able to provide high transmit power and have high power-added efficiency (PAE).

SUMMARY

Techniques for generating a power tracking supply voltage for a circuit (e.g., a power amplifier) that processes multiple transmit signals sent simultaneously are disclosed herein. The multiple transmit signals may comprise transmissions sent simultaneously on multiple carriers at different frequencies.

In one exemplary design, an apparatus includes a power tracker and a power supply generator. The power tracker determines a power tracking signal based on inphase (I) and quadrature (Q) components of a plurality of transmit signals being sent simultaneously, as described below. The power supply generator generates a power supply voltage based on the power tracking signal. The apparatus may further include a power amplifier that amplifies a modulated RF signal based on the power supply voltage and provides an output RF signal.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

Techniques for generating a power tracking supply voltage for a circuit (e.g., a power amplifier) that processes multiple transmit signals sent simultaneously are disclosed herein. The techniques may be used for various electronic devices such as wireless communication devices.

Figure 1:
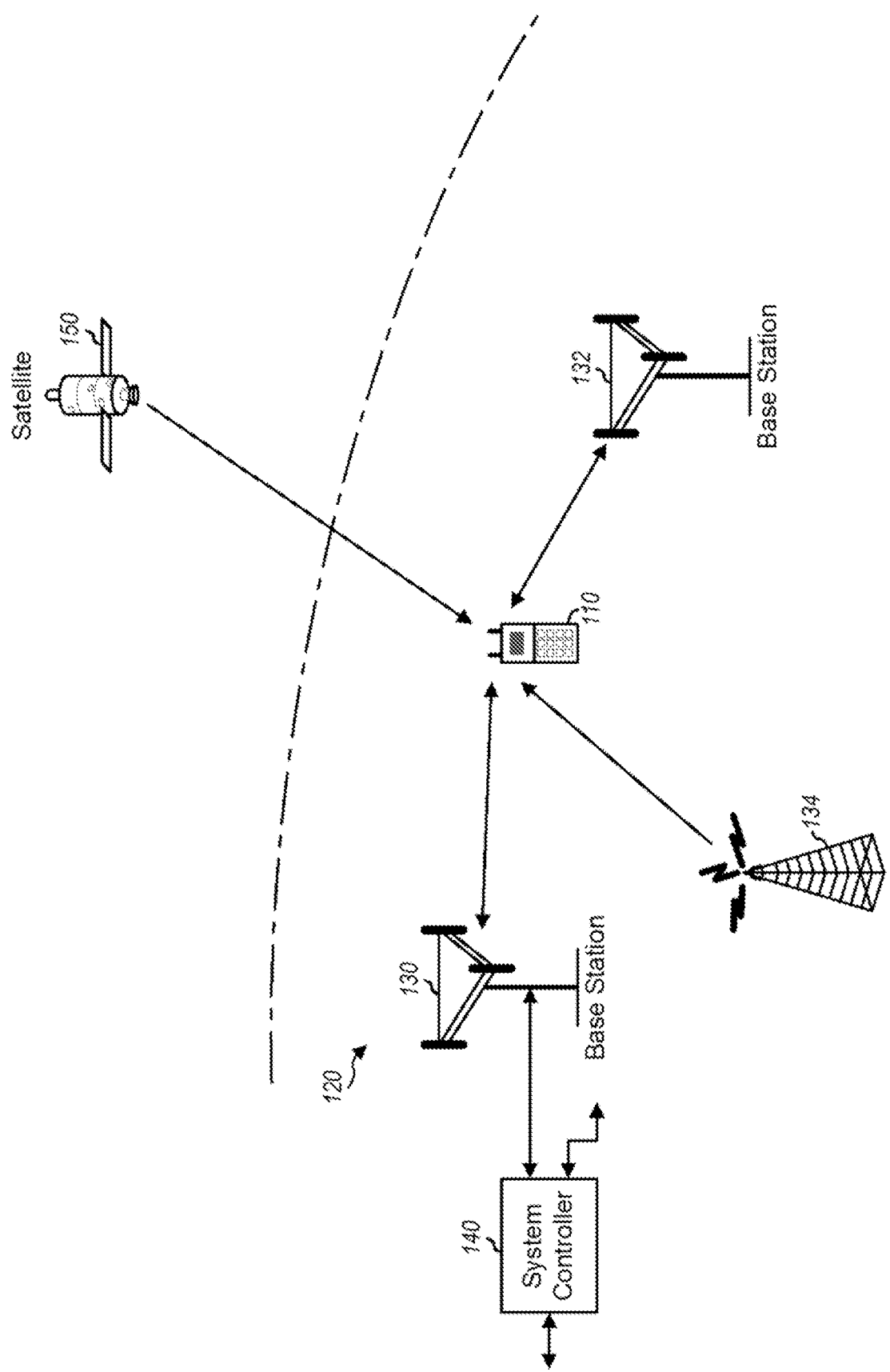
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, TD-SCDMA, GSM, 802.11, etc.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101.

Wireless device 110 may support carrier aggregation, which is operation on multiple carriers. Carrier aggregation may also be referred to as multi-carrier operation. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
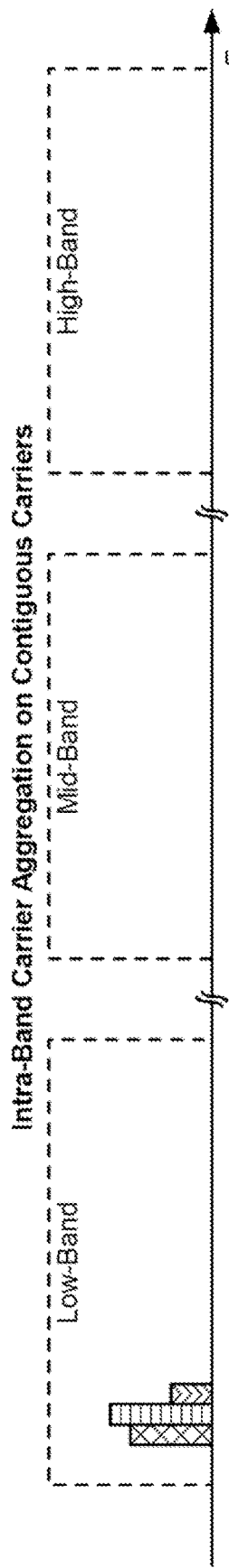
FIGS. 2A to 2D show four examples of carrier aggregation.

FIG. 2A shows an example of contiguous intra-band CA. In the example shown in FIG. 2A, wireless device 110 is configured with three contiguous carriers in one band in low-band. Wireless device 110 may send and/or receive transmissions on the three contiguous carriers in the same band.

Figure 2B:
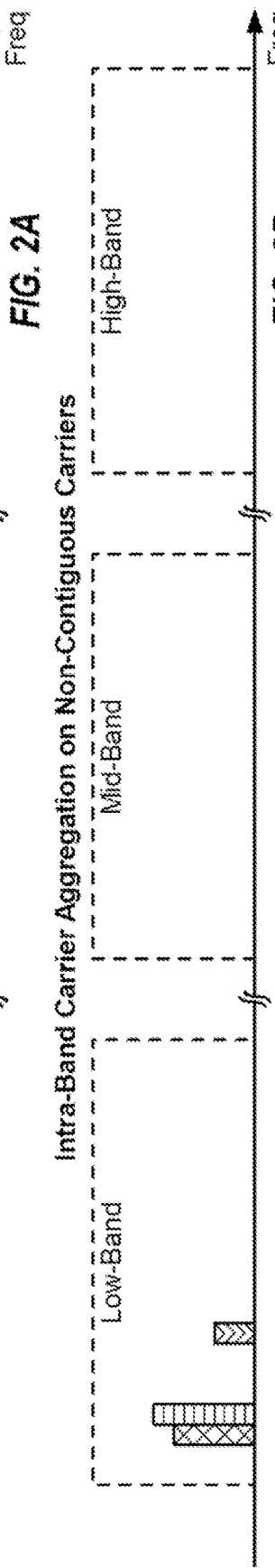

FIG. 2B shows an example of non-contiguous intra-band CA. In the example shown in FIG. 2B, wireless device 110 is configured with three non-contiguous carriers in one band in low-band. The carriers may be separated by 5 MHz, 10 MHz, or some other amount. Wireless device 110 may send and/or receive transmissions on the three non-contiguous carriers in the same band.

Figure 2C:
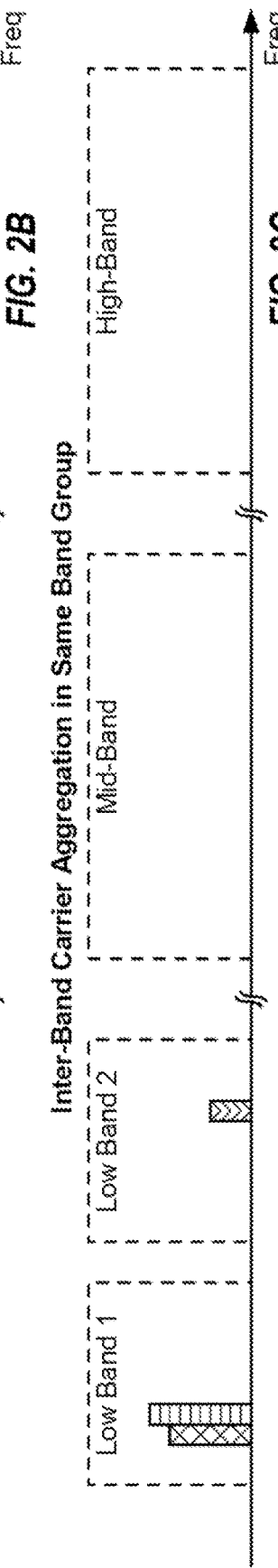

FIG. 2C shows an example of inter-band CA in the same band group. In the example shown in FIG. 2C, wireless device 110 is configured with three carriers in two bands in low-band. Wireless device 110 may send and/or receive transmissions on the three carriers in different bands in the same band group.

Figure 2D:
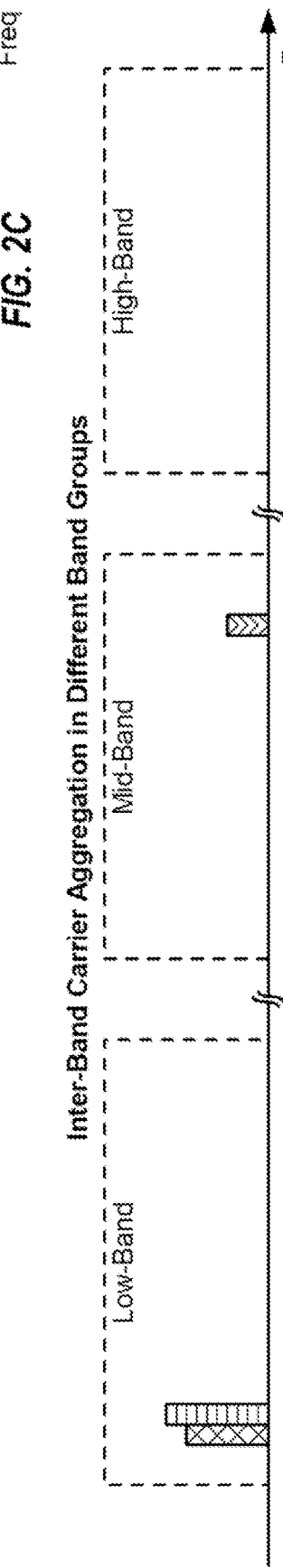

FIG. 2D shows an example of inter-band CA in different band groups. In the example shown in FIG. 2D, wireless device 110 is configured with three carriers in two bands in different band groups, which include two carriers in one band in low-band and one carrier in another band in mid-band. Wireless device 110 may send and/or receive transmissions on the three carriers in different bands in different band groups.

FIGS. 2A to 2D show four examples of carrier aggregation. Carrier aggregation may also be supported for other combinations of bands and band groups.

Figure 3:
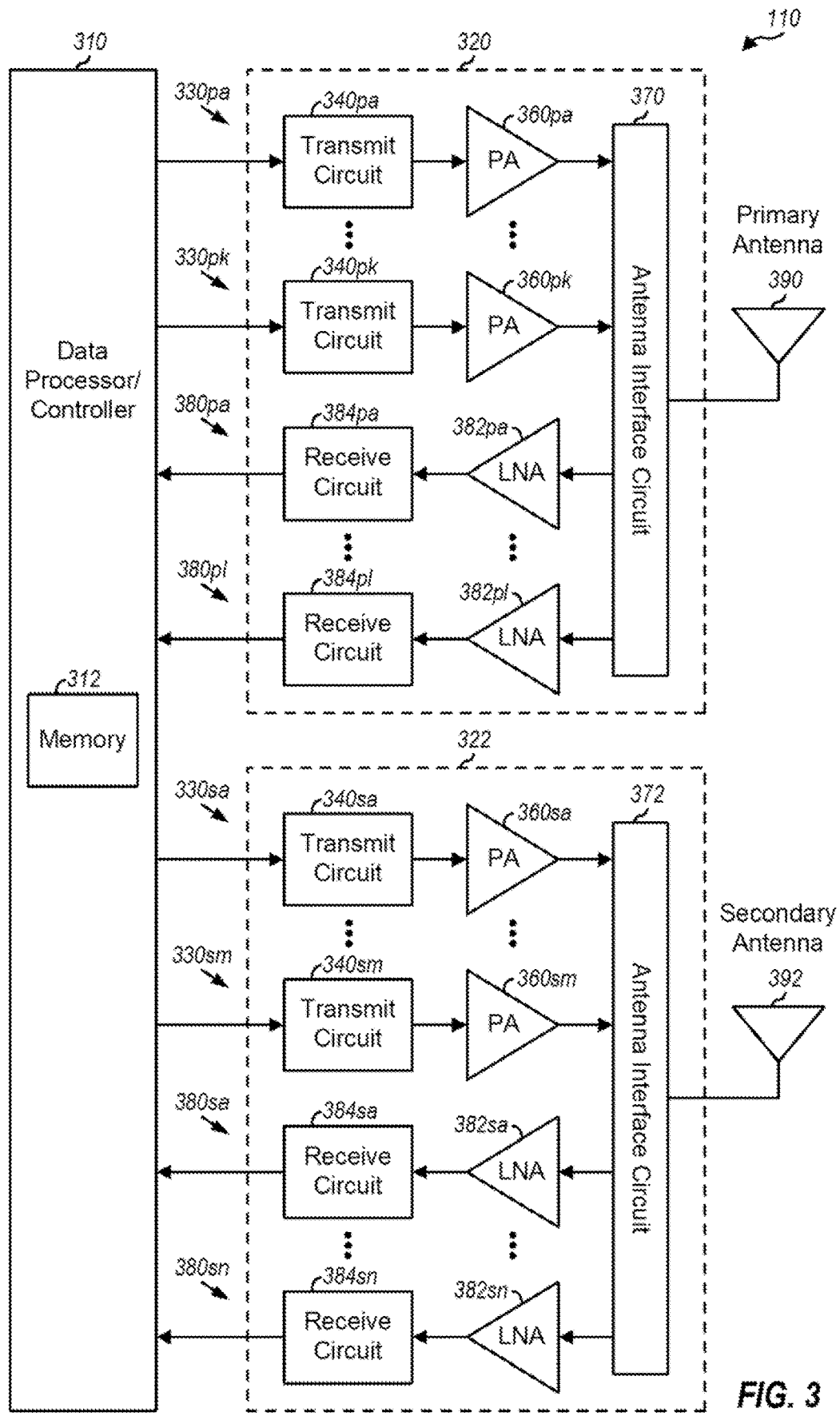
FIG. 3 shows a block diagram of the wireless device in FIG. 1.

FIG. 3 shows a block diagram of an exemplary design of wireless device 110 in FIG. 1.

In this exemplary design, wireless device 110 includes a data processor/controller 310, a transceiver 320 coupled to a primary antenna 390, and a transceiver 322 coupled to a secondary antenna 392. Transceiver 320 includes K transmitters 330pa to 330pk, L receivers 380pa to 380pl, and an antenna interface circuit 370 to support multiple bands, carrier aggregation, multiple radio technologies, etc. K and L may each be any integer value of one or greater. Transceiver 322 includes M transmitters 330sa to 330sm, N receivers 380sa to 380sn, and an antenna interface circuit 372 to support multiple bands, carrier aggregation, multiple radio technologies, receive diversity, multiple-input multiple-output (MIMO) transmission, etc. M and N may each be any integer value of one or greater.

In the exemplary design shown in FIG. 3, each transmitter 330 includes a transmit circuit 340 and a power amplifier (PA) 360. For data transmission, data processor 310 processes (e.g., encodes and symbol maps) data to be transmitted to obtain modulation symbols. Data processor 310 further processes the modulation symbols (e.g., for OFDM, SC-FDMA, CDMA, or some other modulation technique) and provides I and Q samples for each transmit signal to be sent by wireless device 110. A transmit signal is a signal comprising a transmission on one or more carriers, a transmission on one or more frequency channels, etc. Data processor 310 provides the I and Q samples for one or more transmit signals to one or more selected transmitters. The description below assumes that transmitter 330pa is a transmitter selected to send one transmit signal. Within transmitter 330pa, transmit circuit 340pa converts I and Q samples to I and Q analog output signals, respectively. Transmit circuit 340pa further amplifies, filters, and upconverts the I and Q analog output signals from baseband to RF and provides a modulated RF signal. Transmit circuit 340pa may include digital-to-analog converters (DACs), amplifiers, filters, mixers, matching circuits, an oscillator, a local oscillator (LO) generator, a phase-locked loop (PLL), etc. A PA 360pa receives and amplifies the modulated RF signal and provides an output RF signal having the proper transmit power level. The output RF signal is routed through antenna interface circuit 370 and transmitted via antenna 390. Antenna interface circuit 370 may include one or more filters, duplexers, diplexers, switches, matching circuits, directional couplers, etc. Each remaining transmitter 330 in transceivers 320 and 322 may operate in similar manner as transmitter 330pa.

In the exemplary design shown in FIG. 3, each receiver 380 includes a low noise amplifier (LNA) 382 and a receive circuit 384. For data reception, antenna 390 receives signals from base stations and/or other transmitter stations and provides a received RF signal, which is routed through antenna interface circuit 370 and provided to a selected receiver. The description below assumes that receiver 380pa is the selected receiver. Within receiver 380pa, an LNA 382pa amplifies the received RF signal and provides an amplified RF signal. A receive circuit 384pa downconverts the amplified RF signal from RF to baseband, amplifies and filters the downconverted signal, and provides an analog input signal to data processor 310. Receive circuit 384pa may include mixers, filters, amplifiers, matching circuits, an oscillator, an LO generator, a PLL, etc. Each remaining receiver 380 in transceivers 320 and 322 may operate in similar manner as receiver 380pa.

FIG. 3 shows an exemplary design of transmitters 330 and receivers 380. A transmitter and a receiver may also include other circuits not shown in FIG. 3, such as filters, matching circuits, etc. All or a portion of transceivers 320 and 322 may be implemented on one or more analog integrated circuits (ICs), RF ICs (RFICs), mixed-signal ICs, etc. For example, transmit circuits 340, LNAs 382, and receive circuits 384 may be implemented on one module, which may be an RFIC, etc. Antenna interface circuits 370 and 372 and PAs 360 may be implemented on another module, which may be a hybrid module, etc. The circuits in transceivers 320 and 322 may also be implemented in other manners.

Data processor/controller 310 may perform various functions for wireless device 110. For example, data processor 310 may perform processing for data being transmitted via transmitters 330 and data being received via receivers 380. Controller 310 may control the operation of transmit circuits 340, PAs 360, LNAs 382, receive circuits 384, antenna interface circuits 370 and 372, or a combination thereof. A memory 312 may store program codes and data for data processor/controller 310. Data processor/controller 310 may be implemented on one or more application specific integrated circuits (ASICs) and/or other ICs.

Wireless device 110 may send multiple transmit signals simultaneously. In one design, the multiple transmit signals may be for transmissions on multiple contiguous or non-contiguous carriers with intra-band CA., e.g., as shown in FIG. 2A or 2B. For example, each transmit signal may comprise a transmission sent on one carrier. In another design, the multiple transmit signals may be for transmissions on multiple frequency channels to the same wireless system. In yet another design, the multiple transmit signals may be for transmissions sent to different wireless systems (e.g., LTE and WLAN). In any case, data to be sent in each transmit signal may be processed (e.g., encoded, symbol mapped, and modulated) separately to generate I and Q samples for that transmit signal. Each transmit signal may be conditioned by a respective transmit circuit 340 and amplified by a respective PA 360 to generate an output RF signal for that transmit signal.

A PA may receive a modulated RF signal and a power supply voltage and may generate an output RF signal. The output RF signal typically tracks the modulated RF signal and has a time-varying envelope. The power supply voltage should be higher than the amplitude of the output RF signal at all times in order to avoid clipping the output RF signal, which would then cause intermodulation distortion (IMD) that may degrade performance. The difference between the power supply voltage and the envelope of the output RF signal represents wasted power that is dissipated by the PA instead of delivered to an output load.

It may be desirable to generate a power supply voltage for a PA such that good performance and good efficiency can be obtained. This may be achieved by generating the power supply voltage for the PA with power tracking so that the power supply voltage can track the envelope of an output RF signal from the PA.

Figure 4:
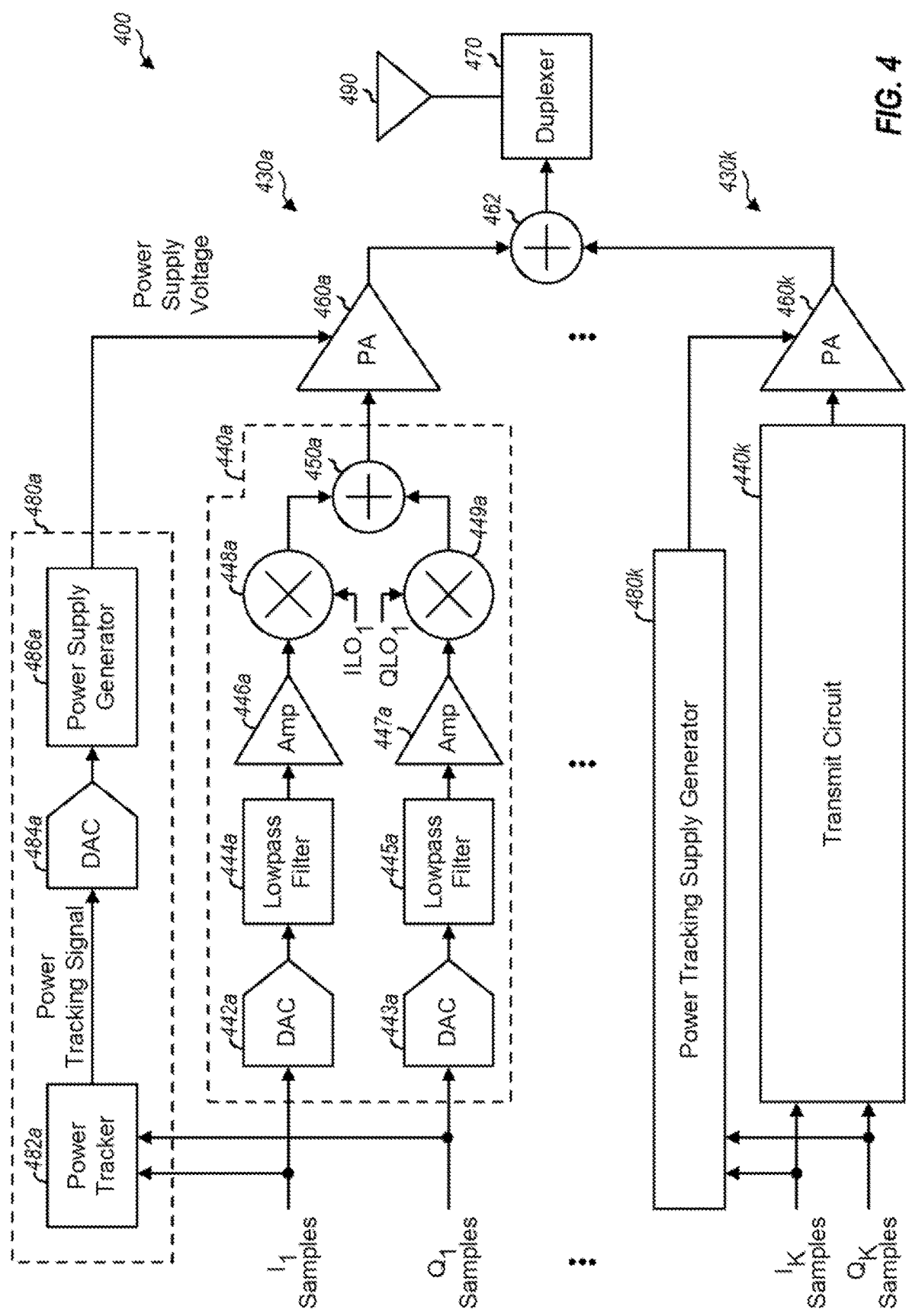
FIG. 4 shows a transmit module comprising a separate power amplifier with separate power tracking for each transmit signal.

FIG. 4 shows a design of a transmit module 400 supporting simultaneous transmission of multiple (K) transmit signals with a separate PA and separate power tracking for each transmit signal. Transmit module 400 includes K transmitters 430a to 430k that can simultaneously process K transmit signals, with each transmitter 430 processing one transmit signal. Each transmitter 430 includes a transmit circuit 440, a PA 460, and a power tracking supply generator 480.

Transmitter 430a receives $I_1$ and $Q_1$ samples for a first transmit signal and generates a first output RF signal for the first transmit signal. The $I_1$ and $Q_1$ samples are provided to both transmit circuit 440a and voltage generator 480a. Within transmit circuit 440a, the $I_1$ and $Q_1$ samples are converted to I and Q analog signals by DACs 442a and 443a, respectively. The I analog signal is filtered by a lowpass filter 444a, amplified by an amplifier (Amp) 446a, and upconverted from baseband to RF by a mixer 448a. Similarly, the Q analog signal is filtered by a lowpass filter 445a, amplified by an amplifier 447a, and upconverted from baseband to RF by a mixer 449a. Mixers 448a and 449a perform upconversion for the first transmit signal based on I and Q LO signals ($ILO_1$ and $QLO_1$) at a center RF frequency of the first transmit signal. A summer 450a sums the I and Q upconverted signals from mixers 448a and 449a to obtain a modulated RF signal, which is provided to PA 460a.

Within voltage generator 480a, a power tracker 482a receives the $I_1$ and $Q_1$ samples for the first transmit signal, computes the power of the first transmit signal based on the $I_1$ and $Q_1$ samples, and provides a digital power tracking signal to a DAC 484a. DAC 484a converts the digital power tracking signal to analog and provides an analog power tracking signal. A power supply generator 486a receives the analog power tracking signal and generates a power supply voltage for PA 460a. PA 460a amplifies the modulated RF signal from transmit circuit 440a using the power supply voltage from supply generator 486a and provides the first output RF signal for the first transmit signal.

Each remaining transmitter 430 may similarly process I and Q samples for a respective transmit signal and may provide an output RF signal for the transmit signal. Up to K PAs 460a to 460k may provide up to K output RF signals at different RF frequencies for up to K transmit signals being sent simultaneously. A summer 462 receives the output RF signals being sent simultaneously, sums the output RF signals, and provides a final output RF signal, which is routed through a duplexer 470 and transmitted via an antenna 490.

As shown in FIG. 4, power tracking may be used to improve the efficiency of PAs 460a to 460k. Each transmit signal may be processed by a respective transmitter 430 using a separate sets of mixers 448 and 449 and PA 460. Multiple transmit signals may be sent on different frequencies (e.g., different carriers) and hence may have increased envelope bandwidth. The increased envelope bandwidth may be addressed by using a separate transmitter 430 for each transmit signal. Each transmitter 430 may then handle the envelope bandwidth of one transmit signal. However, operating multiple transmitters 430 concurrently for multiple transmit signals may result in more circuits, higher power consumption, and increased cost, all of which are undesirable.

In an aspect of the present disclosure, a single PA with power tracking may be used to generate a single output RF signal for multiple transmit signals being sent simultaneously. A single power supply voltage may be generated for the PA to track the power of all transmit signals being sent simultaneously. This may reduce the number of circuit components, reduce power consumption, and provide other advantages.

Figure 5:
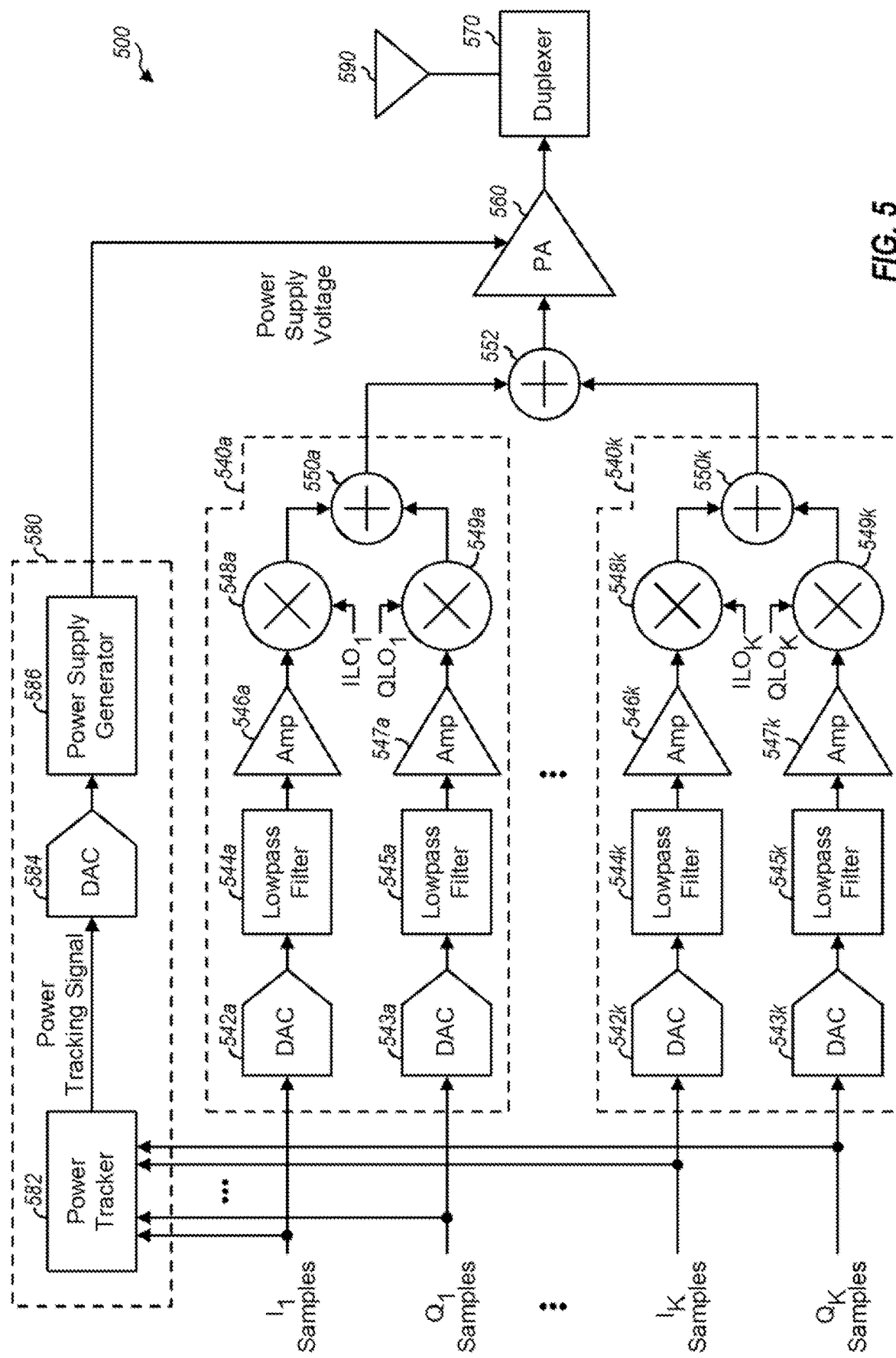
FIGS. 5 and 6 show two designs of a transmit module comprising a single power amplifier with power tracking for all transmit signals.

FIG. 5 shows a design of a transmit module 500 supporting simultaneous transmission of multiple (K) transmit signals with a single PA and power tracking for all transmit signals. Transmit module 500 performs frequency upconversion separately for each transmit signal in the analog domain and sums the resultant upconverted RF signals for all transmit signals. Transmit module 500 includes K transmit circuits 540a to 540k that can simultaneously process K transmit signals, with each transmit circuit 540 processing one transmit signal. Transmit module 500 further includes a summer 552, a PA 560, a duplexer 570, and a power tracking supply generator 580.

Transmit circuit 540a receives $I_1$ and $Q_1$ samples for a first transmit signal and generates a first upconverted RF signal for the first transmit signal. The $I_1$ and $Q_1$ samples are provided to both transmit circuit 540a and voltage generator 580. Within transmit circuit 540a, the $I_1$ and $Q_1$ samples are converted to I and Q analog signals by DACs 542a and 543a, respectively. The I and Q analog signals are filtered by lowpass filters 544a and 545a, amplified by amplifiers 546a and 547a, upconverted from baseband to RF by mixers 548a and 549a, and summed by a summer 550a to generate the first upconverted RF signal. Mixers 548a and 549a perform upconversion for the first transmit signal based on I and Q LO signals at a center RF frequency of the first transmit signal.

Each remaining transmit circuit 540 may similarly process I and Q samples for a respective transmit signal and may provide an upconverted RF signal for the transmit signal. Up to K transmit circuits 540a to 540k may provide up to K upconverted RF signals at different RF frequencies for up to K transmit signals being sent simultaneously. A summer 552 receives the upconverted RF signals from transmit circuits 540a to 540k, sums the upconverted RF signals, and provides a modulated RF signal to PA 560.

Within voltage generator 580, a power tracker 582 receives $I_1$ to $I_K$ samples and $Q_1$ to $Q_K$ samples for all transmit signals being sent simultaneously. Power tracker 582 computes the overall power of all transmit signals based on the I and Q samples for these transmit signals and provides a digital power tracking signal to a DAC 584. DAC 584 converts the digital power tracking signal to analog and provides an analog power tracking signal for all transmit signals. Although not shown in FIG. 5, a lowpass filter may receive and filter an output signal from DAC 584 and provide the analog power tracking signal. A power supply generator 586 receives the analog power tracking signal and generates a power supply voltage for PA 560.

PA 560 amplifies the modulated RF signal from summer 552 using the power supply voltage from supply generator 586. PA 560 provides an output RF signal for all transmit signals being sent simultaneously. The output RF signal is routed through duplexer 570 and transmitted via antenna 590.

Figure 6:
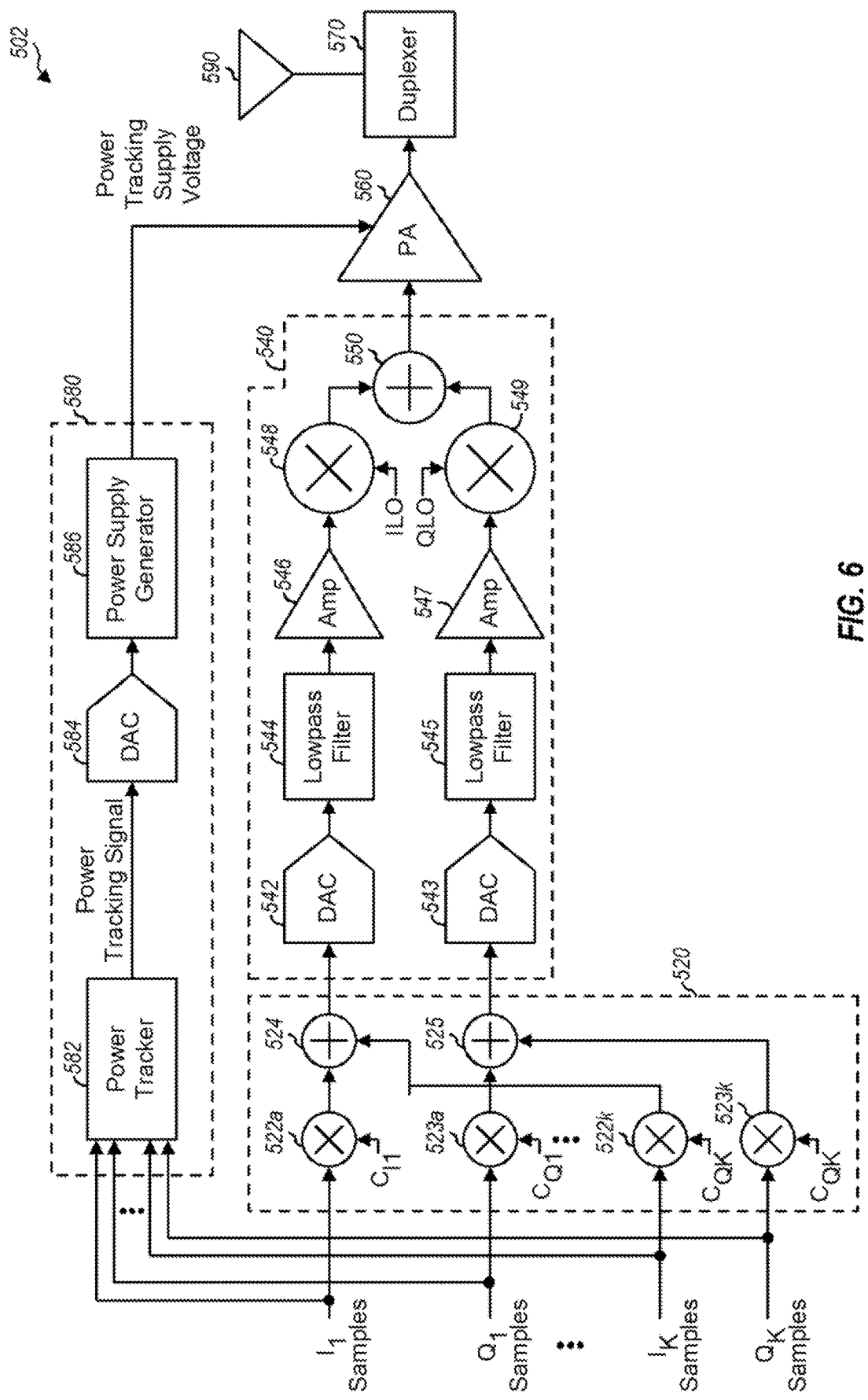

FIG. 6 shows a design of a transmit module 502 supporting simultaneous transmission of multiple (K) transmit signals with a single PA and power tracking for all transmit signals. Transmit module 502 digitally upconverts each transmit signal to an intermediate frequency (IF) in the digital domain, sums the resultant upconverted IF signals for all transmit signals, and performs frequency upconversion from IF to RF for all transmit signals together in the analog domain. Transmit module 502 includes a digital modulator 520, a transmit circuit 540, PA 560, duplexer 570, and power tracking supply generator 580.

Digital modulator 520 receives I and Q samples for all transmit signals and generates a modulated IF signal for all transmit signals. Within digital modulator 520, the $I_1$ and $Q_1$ samples for the first transmit signal are upconverted to a first IF frequency by multipliers 522a and 523a, respectively, based on CH and CO digital LO signals. The I and Q samples for each remaining transmit signal are upconverted to a different IF frequency by multipliers 522 and 523, respectively, for that transmit signal. The IF frequencies of the K transmit signals may be selected based on the final RF frequencies of the K transmit signals. A summer 524 sums the outputs of all K multipliers 522a to 522k and provides an I modulated signal. Similarly, a summer 525 sums the outputs of all K multipliers 523a to 523k and provides a Q modulated signal. The I and Q modulated signals from summers 524 and 525 form the modulated IF signal for all transmit signals.

Transmit circuit 540 receives I and Q modulated signals from digital modulator 520 and generates a modulated RF signal for all transmit signals. Within transmit circuit 540, the I and Q modulated signals are converted to I and Q analog signals by DACs 542 and 543, respectively. The I and Q analog signals are filtered by lowpass filters 544 and 545, amplified by amplifiers 546 and 547, upconverted from IF to RF by mixers 548 and 549, and summed by a summer 550 to generate the modulated RF signal. Mixers 548 and 549 perform upconversion for the modulated IF signal based on I and Q LO signals at a suitable frequency so that the K transmit signals are upconverted to their proper RF frequencies.

Power tracking voltage generator 580 receives the $I_1$ to $I_K$ samples and the $Q_1$ to $Q_K$ samples for all transmit signals being sent simultaneously. Voltage generator 580 generates a power supply voltage for PA 560 based on the I and Q samples. PA 560 amplifies the modulated RF signal from transmit circuit 540 using the power supply voltage from supply generator 580. PA 560 provides an output RF signal for all transmit signals being sent simultaneously. The output RF signal is routed through duplexer 570 and transmitted via antenna 590.

FIGS. 5 and 6 show two exemplary designs of a transmit module supporting simultaneous transmission of multiple transmit signals with a single PA and power tracking for all transmit signals. Multiple transmit signals may also be sent with a single PA and power tracking in other manners. For example, polar modulation may be used instead of quadrature modulation, which is shown in FIGS. 5 and 6.

Power tracker 582 may compute the digital power tracking signal based on the I and Q samples for all transmit signals in various manners. In one design, the digital power tracking signal may be computed as follows:

$$p(t) = \sqrt{K} \cdot \sqrt{I_1^2(t) + Q_1^2(t) + \ldots + I_K^2(t) + Q_K^2(t)},  \quad \text{Eq (1)}$$

where $I_k(t)$ and $Q_k(t)$ denote the I and Q samples for the k-th transmit signal in sample period t, for k=1, ..., K, and p(t) denotes the digital power tracking signal in sample period t.

The quantity $I_k^2(t)+Q_k^2(t)$ denotes the power of the k-th transmit signal in sample period t. In the design shown in equation (1), the powers of all transmit signals are summed to obtain an overall power. The digital power tracking signal is then obtained by taking the square root of the overall power. The scaling factor of $\sqrt{K}$ accounts for conversion between power and voltage.

In another design, the digital power tracking signal may be computed as follows:

$$p(t) = \sqrt{I_1^2(t) + Q_1^2(t)} + \ldots + \sqrt{I_K^2(t) + Q_K^2(t)}. \quad \text{Eq (2)}$$

The quantity $\sqrt{I_k^2(t)+Q_k^2(t)}$ denotes the voltage of the k-th transmit signal in sample period t. In the design shown in equation (2), the voltage of each transmit signal is first computed, and the voltages of all transmit signals are then summed to obtain the digital power tracking signal.

Equations (1) and (2) are two exemplary designs of computing the digital power tracking signal based on the I and Q samples for all transmit signals being sent simultaneously. The digital power tracking signal computed in equation (1) or (2) has a bandwidth that approximates the bandwidth of the widest transmit signal (instead of the overall bandwidth of all transmit signals being sent simultaneously). Having the bandwidth of the power tracking signal being smaller than a modulation bandwidth may allow for a more efficient power tracking circuitry and may also result in less noise being injected into PA 560 via the power supply.

The digital power tracking signal may also be computed based on the I and Q samples of the transmit signals in other manners, e.g., based on other equations or functions. In one design, the digital power tracking signal may be generated based on the I and Q samples for all transmit signals, without any filtering, e.g., as shown in equation (1) or (2). In another design, the digital power tracking signal may be filtered, e.g., with a lowpass filter having similar characteristics as lowpass filters 544 and 545 in transmit circuit 540.

In one design, the digital power tracking signal may be computed in the same manner (e.g., based on the same equation) regardless of the number of transmit signals being sent simultaneously. In another design, the digital power tracking signal may be computed in different manners (e.g., based on different equations) depending on the number of transmit signals being sent simultaneously. The digital power tracking signal may also be computed in different manners depending on other factors such as the transmit power levels of different transmit signals.

The techniques described herein for generating a power tracking supply voltage for multiple transmit signals may be used for various modulation techniques. For example, the techniques may be used to generate a power tracking supply voltage for multiple transmit signals sent simultaneously using orthogonal frequency division multiplexing (OFDM), SC-FDMA, CDMA, or some other modulation techniques. The techniques may also be used to generate a tracking power supply voltage for any number of transmit signals being sent simultaneously.

Figure 7A:
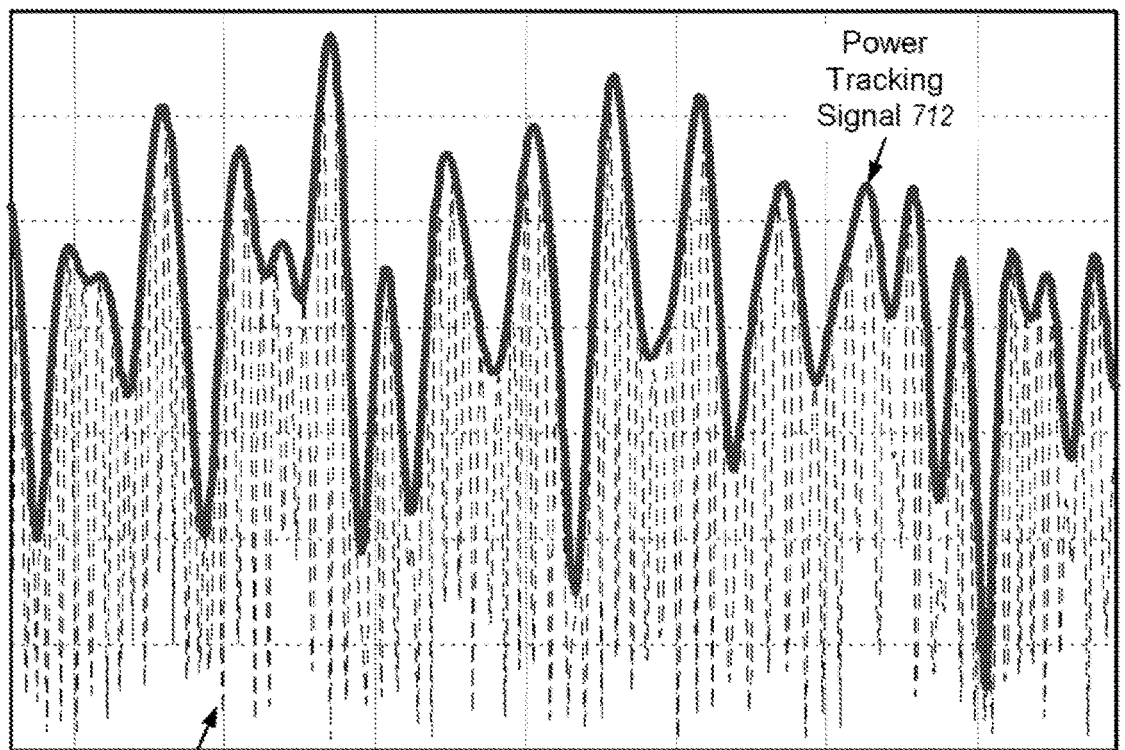
FIGS. 7A and 7B show power tracking for two and three transmit signals, respectively.

FIG. 7A shows an example of power tracking for two transmit signals sent on two non-contiguous carriers with SC-FDMA, e.g., for non-contiguous intra-band CA shown in FIG. 2B. The two transmit signals are sent on two carriers separated by a 25 MHz gap, with each carrier having a bandwidth of 10 MHz. A plot 710 shows an output RF signal comprising the two transmit signals and provided by PA 560 in FIG. 5 or 6. A plot 712 shows a power tracking signal provided by power tracker 582 in FIG. 5 or 6. The power tracking signal is computed based on I and Q samples for the two transmit signals in accordance with equation (1). As shown in FIG. 7A, the power tracking signal closely follows the envelope of the output RF signal. Hence, good performance and high efficiency may be achieved for PA 560.

Figure 7B:
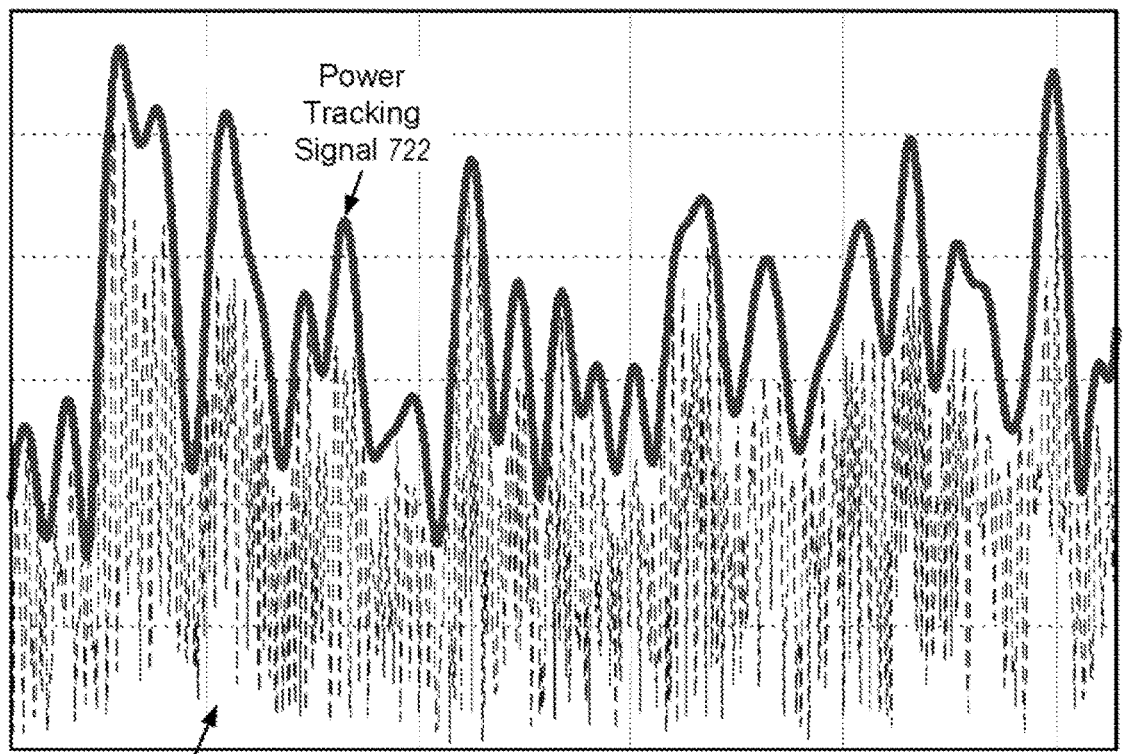

FIG. 7B shows an example of power tracking for three transmit signals sent on three non-contiguous carriers with OFDM, e.g., for non-contiguous intra-band CA. The three transmit signals are sent on three carriers, with each carrier having a bandwidth of 5 MHz and being separated by a 15 MHz gap to another carrier. A plot 720 shows an output RF signal comprising the three transmit signals and provided by PA 560 in FIG. 5 or 6. A plot 722 shows a power tracking signal provided by power tracker 582 in FIG. 5 or 6. The power tracking signal is computed based on I and Q samples for the three transmit signals in accordance with equation (1). As shown in FIG. 7B, the power tracking signal follows the envelope of the output RF signal. Hence, good performance and high efficiency may be achieved for PA 560.

It can be shown that a power tracking supply voltage may also be generated for multiple transmit signals sent on multiple carriers with CDMA. In general, the power tracking supply voltage can closely follow the envelope of the output RF signal when two transmit signals are sent simultaneously, e.g., as shown in FIG. 7A. The power tracking supply voltage can approximate the envelope of the output RF signal when more than two transmit signals are sent simultaneously, e.g., as shown in FIG. 7B.

Power supply generator 586 may generate a power supply voltage for PA 560 based on a power tracking signal in various manners. Power supply generator 586 should generate the power supply voltage in an efficient manner in order to conserve battery power of wireless device 110.

Figure 8:
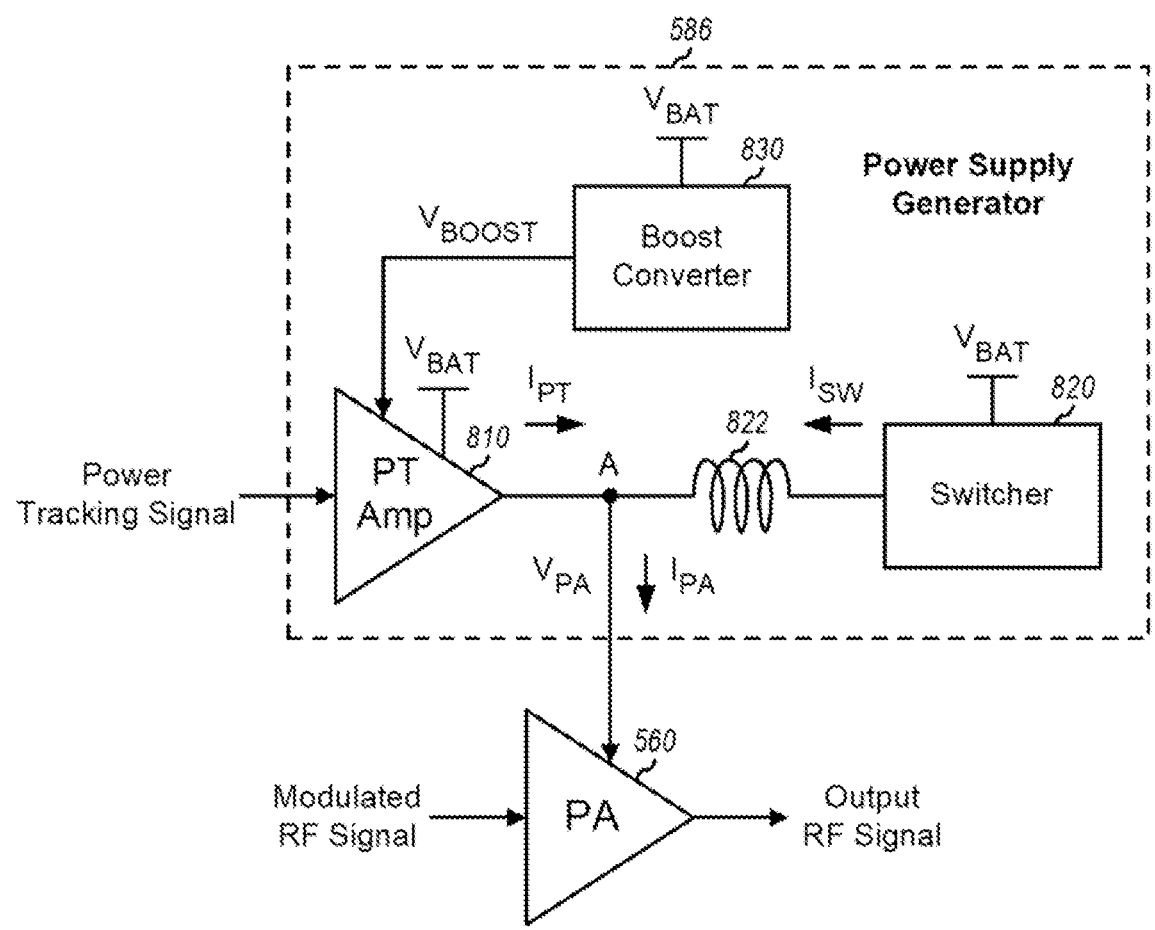
FIGS. 8 and 9 show a design of a power supply generator with power tracking.

FIG. 8 shows a design of power supply generator 586 in FIGS. 5 and 6. In this design, power supply generator 586 includes a power tracking amplifier (PT Amp) 810, a switcher 820, a boost converter 830, and an inductor 822. Switcher 820 may also be referred to as a switching-mode power supply (SMPS). Switcher 820 receives a battery voltage ($V_{BAT}$) and provides a first supply current ($I_{SW}$) comprising DC and low frequency components at node A. Inductor 822 stores current from switcher 820 and provides the stored current to node A on alternating cycles. Boost converter 830 receives the $V_{BAT}$ voltage and generates a boosted supply voltage ($V_{BOOST}$) that is higher than the $V_{BAT}$ voltage. Power tracking amplifier 810 receives the analog power tracking signal at its signal input, receives the $V_{BAT}$ voltage and the $V_{BOOST}$ voltage at its two power supply inputs, and provides a second supply current ($I_{PT}$) comprising high frequency components at node A. The PA supply current ($I_{PA}$) provided to power amplifier 560 includes the $I_{SW}$ current from switcher 820 and the $I_{PT}$ current from power tracking amplifier 810. Power tracking amplifier 810 also provides the proper PA supply voltage ($V_{PA}$) at Node A for PA 560. The various circuits in power supply generator 586 are described in further detail below.

Figure 9:
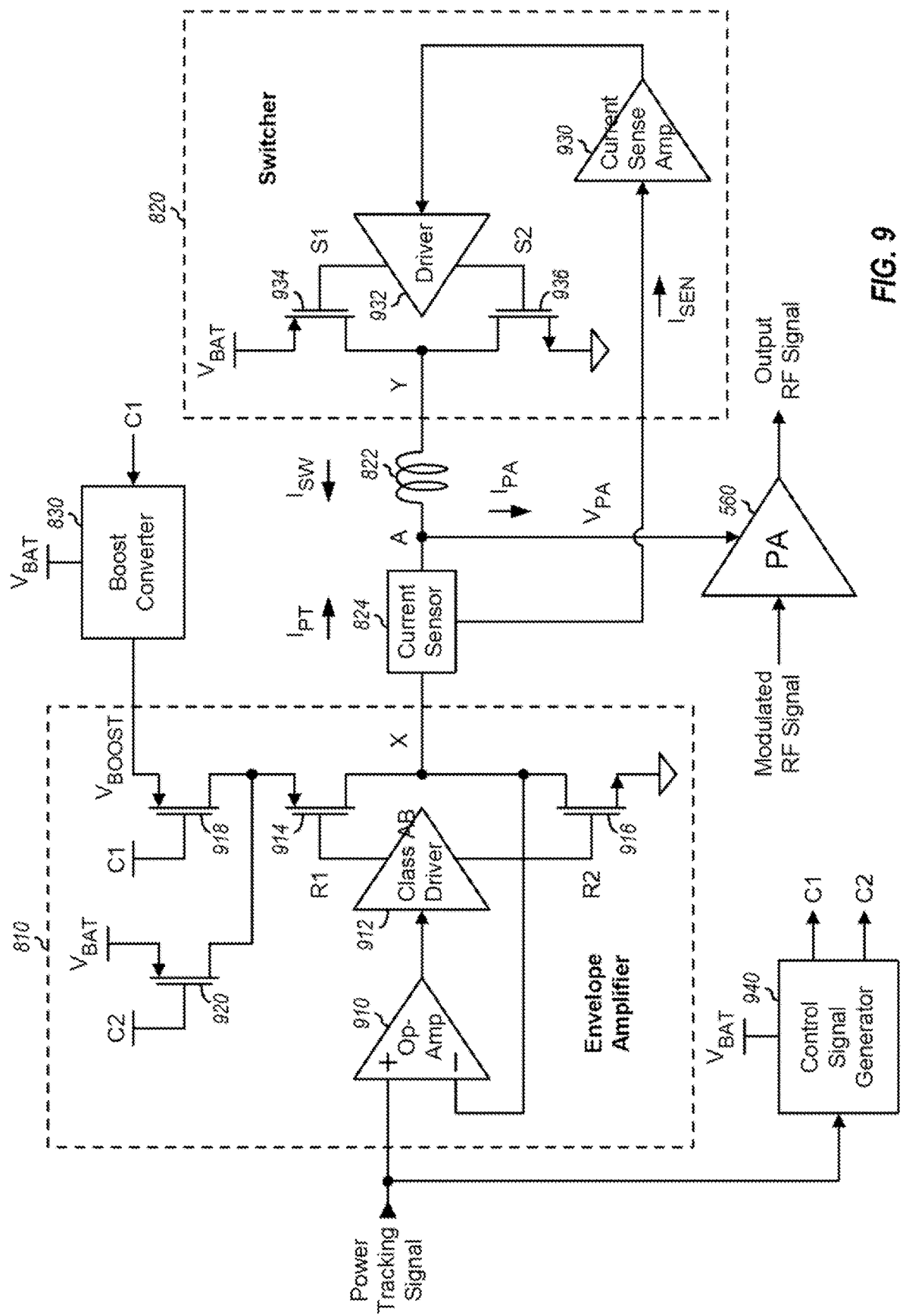

FIG. 9 shows a schematic diagram of a design of power tracking amplifier 810 and switcher 820 within power supply generator 586 in FIG. 8. Within power tracking amplifier 810, an operational amplifier (op-amp) 910 has its non-inverting input receiving the power tracking signal, its inverting input coupled to an output of power tracking amplifier 810 (which is node X), and its output coupled to an input of a class AB driver 912. Driver 912 has its first output (R1) coupled to the gate of a P-channel metal oxide semiconductor (PMOS) transistor 914 and its second output (R2) coupled to the gate of an N-channel metal oxide semiconductor (NMOS) transistor 916. NMOS transistor 916 has its drain coupled to node X and its source coupled to circuit ground. PMOS transistor 914 has its drain coupled to node X and its source coupled to the drains of PMOS transistors 918 and 920. PMOS transistor 918 has its gate receiving a C1 control signal and its source receiving the $V_{BOOST}$ voltage. PMOS transistor 920 has its gate receiving a C2 control signal and its source receiving the $V_{BAT}$ voltage.

A current sensor 824 is coupled between node X and node A and senses the $I_{PT}$ current provided by power tracking amplifier 810. Sensor 824 passes most of the $I_{PT}$ current to node A and provides a small fraction of the $I_{PT}$ current as a sensed current ($I_{SEN}$) to switcher 820.

Within switcher 820, a current sense amplifier 930 has its input coupled to current sensor 824 and its output coupled to an input of a switcher driver 932. Driver 932 has its first output (S1) coupled to the gate of a PMOS transistor 934 and its second output (S2) coupled to the gate of an NMOS transistor 936. NMOS transistor 936 has its drain coupled to an output of switcher 820 (which is node Y) and its source coupled to circuit ground. PMOS transistor 934 has its drain coupled to node Y and its source receiving the $V_{BAT}$ voltage. Inductor 822 is coupled between node A and node Y.

Switcher 820 operates as follows. Switcher 820 is in an ON state when current sensor 824 senses a high output current from power tracking amplifier 810 and provides a low sensed voltage to driver 932. Driver 932 then provides a low voltage to the gate of PMOS transistor 934 and a low voltage to the gate of NMOS transistor 936. PMOS transistor 934 is turned ON and couples the $V_{BAT}$ voltage to inductor 822, which stores energy from the $V_{BAT}$ voltage. The current through inductor 822 rises during the ON state, with the rate of the rise being dependent on (i) the difference between the $V_{BAT}$ voltage and the $V_{PA}$ voltage at node A and (ii) the inductance of inductor 822. Conversely, switcher 820 is in an OFF state when current sensor 824 senses a low output current from power tracking amplifier 810 and provides a high sensed voltage to driver 932. Driver 932 then provides a high voltage to the gate of PMOS transistor 934 and a high voltage to the gate of NMOS transistor 936. NMOS transistor 936 is turned ON, and inductor 822 is coupled between node A and circuit ground. The current through inductor 822 falls during the OFF state, with the rate of the fall being dependent on the $V_{PA}$ voltage at node A and the inductance of inductor 822. The $V_{BAT}$ voltage thus provides current to PA 560 via inductor 822 during the ON state, and inductor 120 provides its stored energy to PA 560 during the OFF state.

Power tracking amplifier 810 operates as follows. When the power tracking signal increases, the output of op-amp 910 increases, the R1 output of driver 912 deceases and the R2 output of driver 912 decreases until NMOS transistor 916 is almost turned OFF, and the output of power tracking amplifier 810 increases. The converse is true when the power tracking signal decreases. The negative feedback from the output of power tracking amplifier 810 to the inverting input of op-amp 910 results in power tracking amplifier 810 having unity gain. Hence, the output of power tracking amplifier 810 follows the power tracking signal, and the $V_{PA}$ voltage is approximately equal to the power tracking signal. Driver 912 may be implemented with a class AB amplifier to improve efficiency, so that large output currents can be supplied even though the bias current in transistors 914 and 916 is low.

In one design, power tracking amplifier 810 operates based on the $V_{BOOST}$ voltage only when needed and based on the $V_{BAT}$ voltage during the remaining time in order to improve efficiency. For example, power tracking amplifier 810 may provide approximately 85% of the power based on the $V_{BAT}$ voltage and only approximately 15% of the power based on the $V_{BOOST}$ voltage. When a high $V_{PA}$ voltage is needed for PA 560 due to a large envelope of the output RF signal, the C1 control signal is at logic low, and the C2 control signal is at logic high. In this case, boost converter 830 is enabled and generates the $V_{BOOST}$ voltage, PMOS transistor 918 is turned ON and provides the $V_{BOOST}$ voltage to the source of PMOS transistor 914, and PMOS transistor 920 is turned OFF. Conversely, when a high $V_{PA}$ voltage is not needed for PA 560, the C1 control signal is at logic high, and the C2 control signal is at logic low. In this case, boost converter 830 is disabled, PMOS transistor 918 is turned OFF, and PMOS transistor 920 is turned ON and provides the $V_{BAT}$ voltage to the source of PMOS transistor 914.

A control signal generator 940 receives the power tracking signal and the $V_{BAT}$ voltage and generates the C1 and C2 control signals. The C1 control signal is complementary to the C2 control signal. In one design, generator 940 generates the C1 and C2 control signals to select the $V_{BOOST}$ voltage for power tracking amplifier 910 when the magnitude of the power tracking signal exceeds a first threshold. The first threshold may be a fixed threshold or may be determined based on the $V_{BAT}$ voltage. In another design, generator 940 generates the C1 and C2 control signals to select the $V_{BOOST}$ voltage for power tracking amplifier 910 when the magnitude of the power tracking signal exceeds the first threshold and the $V_{BAT}$ voltage is below a second threshold. Generator 940 may also generate the C1 and C2 signals based on other signals, other voltages, and/or other criteria.

Switcher 820 has high efficiency and delivers a majority of the supply current for PA 560.

Power tracking amplifier 810 operates as a linear stage and has relatively high bandwidth (e.g., in the MHz range). Switcher 820 operates to reduce the output current from power tracking amplifier 810, which improves overall efficiency.

FIG. 9 shows an exemplary design of switcher 820 and power tracking amplifier 810 in FIG. 1. Switcher 820 and power tracking amplifier 810 may also be implemented in other manners. For example, power tracking amplifier 810 may be implemented as described in U.S. Pat. No. 6,300,826, entitled "Apparatus and Method for Efficiently Amplifying Wideband Envelope Signals," issued Oct. 9, 2001.

In an exemplary design, an apparatus (e.g., an integrated circuit, a wireless device, a circuit module, etc.) may comprise a power tracker and a power supply generator. The power tracker (e.g., power tracker 582 in FIG. 5) may determine a power tracking signal based on I and Q components (e.g., I and Q samples) of a plurality of transmit signals being sent simultaneously. The power supply generator (e.g., power supply generator 586 in FIG. 5) may generate a power supply voltage based on the power tracking signal.

In one design, the power tracker may determine an overall power of the plurality of transmit signals based on the I and Q components of the plurality of transmit signals, e.g., as $I_1^2(t)+Q_1^2(t)+ \ldots +I_K^2(t)+Q_K^2(t)$. The power tracker may then determine the power tracking signal based on the overall power of the plurality of transmit signals, e.g., as shown in equation (1). In another design, the power tracker may determine the power of each transmit signal based on the I and Q components of that transmit signal, e.g., as $I_k^2(t)+Q_k^2(t)$ for the k-th transmit signal. The power tracker may then determine the power tracking signal based on the powers of the plurality of transmit signals, e.g., as shown in equation (2). The power tracker may determine a voltage of each transmit signal based on the power of the transmit signal, e.g., as $\sqrt{I_k^2(t)+Q_k^2(t)}$. The power tracker may then determine the power tracking signal based on voltages of the plurality of transmit signals, e.g., as shown in equation (2). The power tracker may also determine the power tracking signal based on the I and Q components of the plurality of transmit signals in other manners. In one design, the plurality of transmit signals may be sent on a plurality of carriers at different frequencies. The power tracking signal may have a bandwidth that is smaller than an overall bandwidth of the plurality of carriers.

In one design, the apparatus may comprise a plurality of transmit circuits and a summer, e.g., as shown in FIG. 5. The plurality of transmit circuits (e.g., transmit circuits 540a to 540k) may receive the I and Q components of the plurality of transmit signals and may provide a plurality of upconverted RF signals. Each transmit circuit may upconvert I and Q components of one transmit signal and provide a corresponding upconverted RF signal. The summer (e.g., summer 552) may sum the plurality of upconverted RF signals and provide a modulated RF signal. In another design, the apparatus may comprise a transmit circuit (e.g., transmit circuit 540 in FIG. 6) that may receive a modulated IF signal for the plurality of transmit signals and provide a modulated RF signal. The modulated IF signal may be generated (e.g., by digital modulator 520 in FIG. 6) based on the I and Q components of the plurality of transmit signals. In an exemplary design, the apparatus may further comprise a PA (e.g., PA 560 in FIGS. 5 and 6) that may amplify the modulated RF signal based on the power supply voltage and provide an output RF signal.

In an exemplary design, the power supply generator may comprise a power tracking amplifier (e.g., power tracking amplifier 810 in FIGS. 8 and 9) that may receive the power tracking signal and generate the power supply voltage. The power supply generator may further comprise a switcher and/or a boost converter. The switcher (e.g., switcher 820 in FIGS. 8 and 9) may sense a first current (e.g., the $I_{PT}$ current) from the power tracking amplifier and provide a second current (e.g., the $I_{SW}$ current) for the power supply voltage based on the sensed first current. The boost converter (e.g., boost converter 830 in FIGS. 8 and 9) may receive a battery voltage and provide a boosted voltage for the power tracking amplifier. The power tracking amplifier may operate based on the boosted voltage or the battery voltage.

Figure 10:
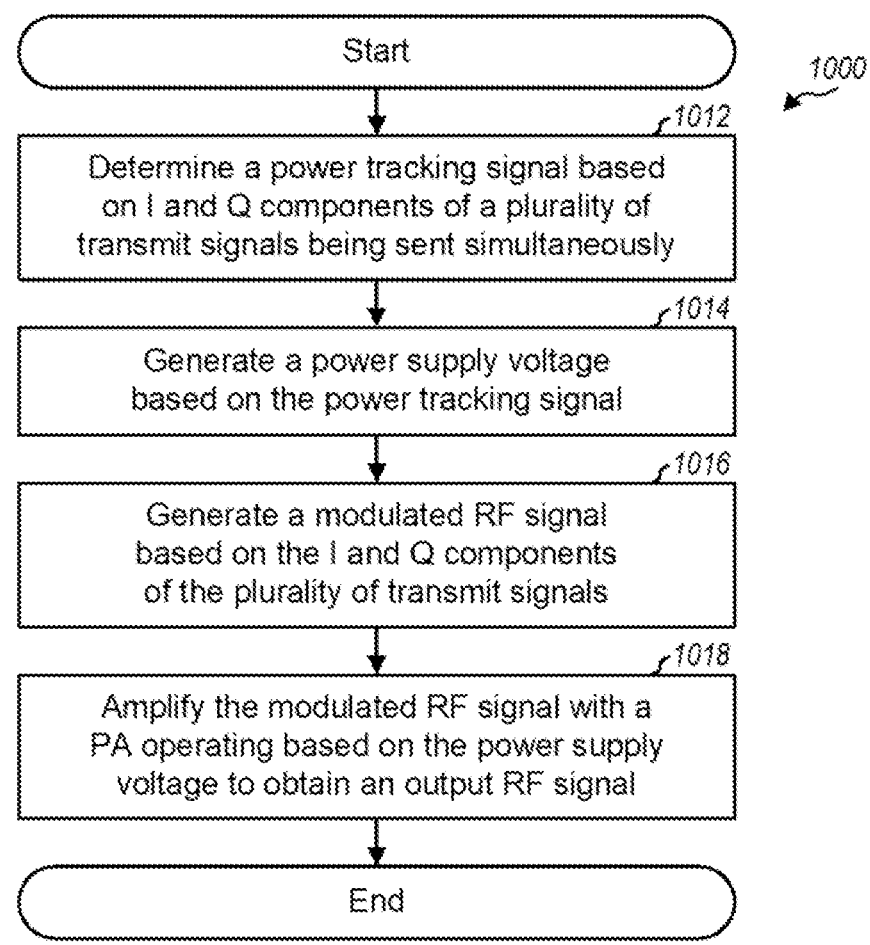
FIG. 10 shows a process for generating a power supply voltage with power tracking.

FIG. 10 shows a design of a process 1000 for generating a power supply voltage with power tracking. A power tracking signal may be determined based on I and Q components of a plurality of transmit signals being sent simultaneously (block 1012). In one design of block 1012, an overall power of the plurality of transmit signals may be determined based on the I and Q components of the plurality of transmit signals. The power tracking signal may then be determined based on the overall power of the plurality of transmit signals, e.g., as shown in equation (1). In another design of block 1012, the power of each transmit signal may be determined based on the I and Q components of the transmit signal. The power tracking signal may then be determined based on the powers of the plurality of transmit signals, e.g., as shown in equation (2).

A power supply voltage may be generated based on the power tracking signal (block 1014). In one design, the power supply voltage may be generated with a amplifier (e.g., amplifier 810 in FIG. 9) that tracks the power tracking signal. The power supply voltage may also be generated based on a switcher and/or a boost converter.

A modulated RF signal may be generated based on the I and Q components of the plurality of transmit signals (block 1016). In one design, I and Q components of each transmit signal may be upconverted to obtain a corresponding upconverted RF signal. A plurality of upconverted RF signals for the plurality of transmit signals may then be summed to obtain the modulated RF signal, e.g., as shown in FIG. 5. In another design, a modulated IF signal may be generated based on the I and Q components of the plurality of transmit signals, e.g., as shown in FIG. 6. The modulated IF signal may then be upconverted to obtain the modulated RF signal. In any case, the modulated RF signal may be amplified with a PA (e.g., PA 560 in FIGS. 5 and 6) operating based on the power supply voltage to obtain an output RF signal (block 1018).

The power tracker and power supply generator described herein may be implemented on an IC, an analog IC, an RFIC, a mixed-signal IC, an ASIC, a printed circuit board (PCB), an electronic device, etc. The power tracker and power supply generator may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the power tracker and/or power supply generator described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a power tracker configured to determine a power tracking signal based on in-phase (I) and quadrature (Q) components of a plurality of transmit signals being sent simultaneously, the plurality of transmit signals configured for transmission from the apparatus to a base station on a plurality of carriers at different frequencies with carrier aggregation;
   a power supply generator configured to generate a power supply voltage based on the power tracking signal;
   at least one transmit circuit configured to generate a modulated radio frequency (RF) signal based on the I and Q components of the plurality of transmit signals; and
   a power amplifier (PA) configured to receive the power supply voltage and the modulated RF signal to produce an output RF signal.

2. The apparatus of claim 1, wherein the plurality of transmit signals are configured for transmission with contiguous intra-band carrier aggregation.

3. The apparatus of claim 2, wherein the power tracking signal has a bandwidth that is smaller than an overall bandwidth of the plurality of carriers.

4. The apparatus of claim 1, further comprising a digital-to-analog converter configured to receive a digital power tracking signal from the power tracker and provide an analog power tracking signal to the power supply generator.

5. The apparatus of claim 1, wherein the plurality of transmit signals comprise Single Carrier Frequency Division Multiple Access (SC-FDMA) signals.

6. The apparatus of claim 1, wherein the power tracker is configured to:
 determine an overall power of the plurality of transmit signals based on the I and Q components of the plurality of transmit signals, and
 determine the power tracking signal based on the overall power of the plurality of transmit signals.

7. The apparatus of claim 6, wherein the overall power is a sum of powers of each of the transmit signals in a form of $I_1^2(t)+Q_1^2(t)+\ldots+I_K^2(t)+Q_K^2(t)$, wherein $I_K^2(t)+Q_K^2(t)$ denotes a power of the k-th transmit signal in sample period t.

8. The apparatus of claim 7, wherein the power tracker is configured to determine the overall power of the plurality of transmit signals based on the I and Q components of the plurality of transmit signals at baseband.

9. The apparatus of claim 1, wherein the power tracker is configured to:
 determine a power of each transmit signal in the plurality of transmit signals based on I and Q components of the transmit signal, and
 determine the power tracking signal based on powers of the plurality of transmit signals.

10. The apparatus of claim 1, wherein the power tracker is configured to:
 determine a power of each transmit signal in the plurality of transmit signals based on I and Q components of the transmit signal,
 determine a voltage of each transmit signal based on the power of the transmit signal, and
 determine the power tracking signal based on voltages of the plurality of transmit signals.

11. The apparatus of claim 1, wherein the at least one transmit circuit comprises a plurality of transmit circuits.

12. The apparatus of claim 1, wherein the at least one transmit circuit comprises a single transmit circuit.

13. The apparatus of claim 1, the power supply generator comprising:
 a power tracking amplifier configured to receive the power tracking signal and generate the power supply voltage.

14. The apparatus of claim 13, the power supply generator further comprising:
 a switcher configured to sense a first current from the power tracking amplifier and provide a second current for the power supply voltage based on the sensed first current.

15. The apparatus of claim 13, the power supply generator further comprising:
 a boost converter configured to receive a battery voltage and provide a boosted voltage for the power tracking amplifier.

16. The apparatus of claim 15, wherein the power tracking amplifier operates selectively based on the boosted voltage or the battery voltage.

17. The apparatus of claim 1, wherein the apparatus comprises a cellular phone, smartphone, tablet, or laptop computer.

18. The apparatus of claim 1, wherein the power tracker is configured to determine the power tracking signal based on the I and Q components of the plurality of transmit signals at baseband.

19. A method comprising:
 determining a power tracking signal based on in-phase (I) and quadrature (Q) components of a plurality of transmit signals being sent simultaneously, the plurality of transmit signals configured for transmission to a base station on a plurality of carriers at different frequencies with carrier aggregation;
 generating a power supply voltage based on the power tracking signal;
 generating a modulated radio frequency (RF) signal based on the I and Q components of the plurality of transmit signals; and
 receiving the power supply voltage and the modulated RF signal in a power amplifier (PA), and producing, by the PA, an output RF signal.

20. The method of claim 19, wherein the plurality of transmit signals are configured for transmission with contiguous intra-band carrier aggregation.

21. The method of claim 20, wherein the power tracking signal has a bandwidth that is smaller than an overall bandwidth of the plurality of carriers.

22. The method of claim 19, wherein the plurality of transmit signals comprise Single Carrier Frequency Division Multiple Access (SC-FDMA) signals.

23. An apparatus comprising:
 means for determining a power tracking signal based on in-phase (I) and quadrature (Q) components of a plurality of transmit signals being sent simultaneously, the plurality of transmit signals configured for transmission from the apparatus to a wireless communication system on a plurality of carriers at different frequencies with carrier aggregation;
 means for generating a power supply voltage based on the power tracking signal;
 means for generating a modulated radio frequency (RF) signal based on the I and Q components of the plurality of transmit signals; and
 means for amplifying the modulated RF signal using the power supply voltage to produce an output RF signal.

24. A non-transitory computer-readable medium comprising instructions, that when executed by a processor, cause an apparatus to:
 determine a power tracking signal based on in-phase (I) and quadrature (Q) components of a plurality of transmit signals being sent simultaneously, the plurality of transmit signals configured for transmission from the apparatus to a wireless communication system on a plurality of carriers at different frequencies with carrier aggregation;
 generate a power supply voltage based on the power tracking signal;
 generate a modulated radio frequency (RF) signal based on the I and Q components of the plurality of transmit signals; and
 amplify the modulated RF signal using the power supply voltage to produce an output RF signal.

* * * * *